(12) United States Patent
Masuoka et al.

(10) Patent No.: US 9,082,838 B2
(45) Date of Patent: *Jul. 14, 2015

(54) METHOD FOR PRODUCING A SEMICONDUCTOR DEVICE AND SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP); Hiroki Nakamura, Tokyo (JP); Navab Singh, Singapore (SG); Zhixian Chen, Singapore (SG); Aashit Ramachandra Kamath, Singapore (SG); Xinpeng Wang, Singapore (SG)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 38 days.

This patent is subject to a terminal disclaimer.

(21) Appl. No.: 14/036,554

(22) Filed: Sep. 25, 2013

(65) Prior Publication Data

US 2014/0091372 A1    Apr. 3, 2014

Related U.S. Application Data

(60) Provisional application No. 61/706,960, filed on Sep. 28, 2012.

(51) Int. Cl.
*H01L 21/70* (2006.01)
*H01L 29/78* (2006.01)
(Continued)

(52) U.S. Cl.
CPC ............ *H01L 29/78* (2013.01); *H01L 29/4238* (2013.01); *H01L 29/42356* (2013.01);
(Continued)

(58) Field of Classification Search
CPC . H01L 21/336; H01L 21/8238; H01L 27/092; H01L 29/78; H01L 27/088
USPC ........... 438/151, 197, 199; 257/288, 368, 369
See application file for complete search history.

(56) References Cited

U.S. PATENT DOCUMENTS 6,300,198 B1 * 10/2001 Aeugle et al. ................ 438/268
2004/0150037 A1 * 8/2004 Katsumata et al. ........... 257/330
(Continued)

FOREIGN PATENT DOCUMENTS

JP       0271556 A       3/1990
JP       02188966 A      7/1990
(Continued)

OTHER PUBLICATIONS

Yang, B., "Vertical Silicon-Nanowire Formation and Gate-All-Around MOSFET," Electron Device Letters, Jul. 2008, IEEE, vol. 29, No. 7, pp. 791-794, doi: 10.1109/LED.2008.2000617.

*Primary Examiner* — Jarrett Stark
*Assistant Examiner* — Shahed Ahmed
(74) *Attorney, Agent, or Firm* — Laurence A. Greenberg; Werner H. Sterner; Ralph E. Locher

(57) ABSTRACT

In a first step, a planar silicon layer is formed on a silicon substrate and first and second pillar-shaped silicon layers are formed on the planar silicon layer; a second step includes forming an oxide film hard mask on the first and second pillar-shaped silicon layers, and forming a second oxide film on the planar silicon layer, the second oxide film being thicker than a gate insulating film; and a third step includes forming the gate insulating film around each of the first pillar-shaped silicon layer and the second pillar-shaped silicon layer, forming a metal film and a polysilicon film around the gate insulating film, the polysilicon film having a thickness that is smaller than one half a distance between the first pillar-shaped silicon layer and the second pillar-shaped silicon layer, forming a third resist for forming a gate line, and performing anisotropic etching to form the gate line.

9 Claims, 43 Drawing Sheets

(51) Int. Cl.
  *H01L 29/66* (2006.01)
  *H01L 29/423* (2006.01)
  *H01L 29/49* (2006.01)

(52) U.S. Cl.
  CPC .... *H01L29/66477* (2013.01); *H01L 29/66666* (2013.01); *H01L 29/7827* (2013.01); *H01L 29/4958* (2013.01)

(56) References Cited

U.S. PATENT DOCUMENTS

| | | | | |
|---|---|---|---|---|
| 2007/0257277 A1* | 11/2007 | Takeda et al. | ................. | 257/204 |
| 2008/0136030 A1* | 6/2008 | Chang et al. | ................... | 257/751 |
| 2009/0242972 A1* | 10/2009 | Cho | .............................. | 257/329 |
| 2010/0207201 A1 | 8/2010 | Masuoka et al. | | |
| 2010/0210096 A1 | 8/2010 | Masuoka et al. | | |
| 2010/0264485 A1* | 10/2010 | Masuoka et al. | .............. | 257/329 |
| 2010/0320530 A1* | 12/2010 | Cheng | ........................... | 257/329 |
| 2011/0049629 A1* | 3/2011 | Ishikawa et al. | ............. | 257/350 |
| 2011/0062523 A1* | 3/2011 | Masuoka et al. | .............. | 257/368 |
| 2011/0068401 A1* | 3/2011 | Izumida et al. | ............... | 257/347 |
| 2011/0104862 A1* | 5/2011 | Kadoya | ........................ | 438/270 |
| 2011/0303973 A1 | 12/2011 | Masuoka et al. | | |
| 2013/0328158 A1* | 12/2013 | Ranganathan et al. | ....... | 257/506 |

FOREIGN PATENT DOCUMENTS

| | | |
|---|---|---|
| JP | 03145761 A | 6/1991 |
| JP | 2009-182318 A | 8/2009 |
| JP | 2009182317 A | 8/2009 |
| JP | 2012-004244 A | 1/2012 |
| WO | 2009/096002 A1 | 8/2009 |

* cited by examiner

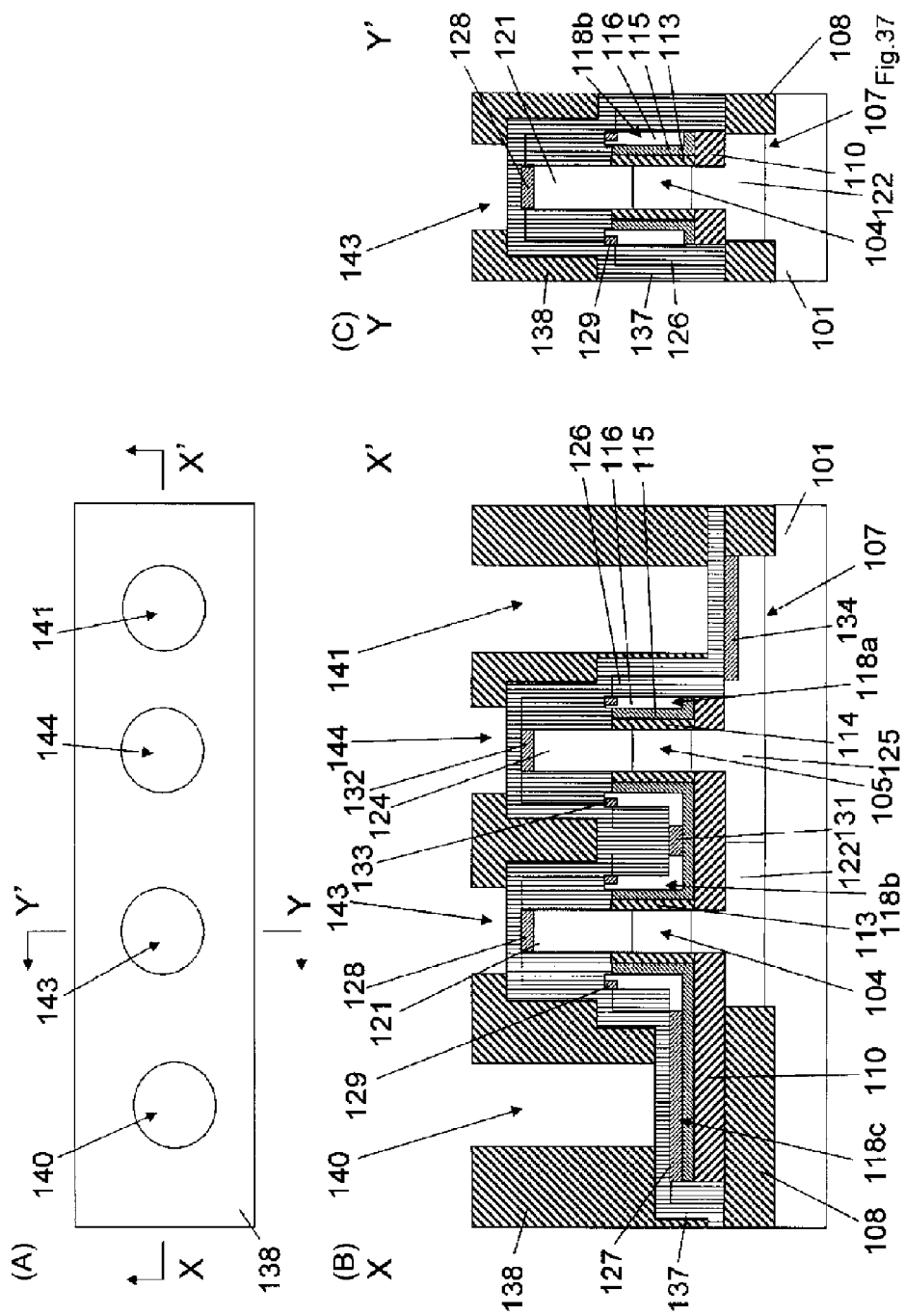

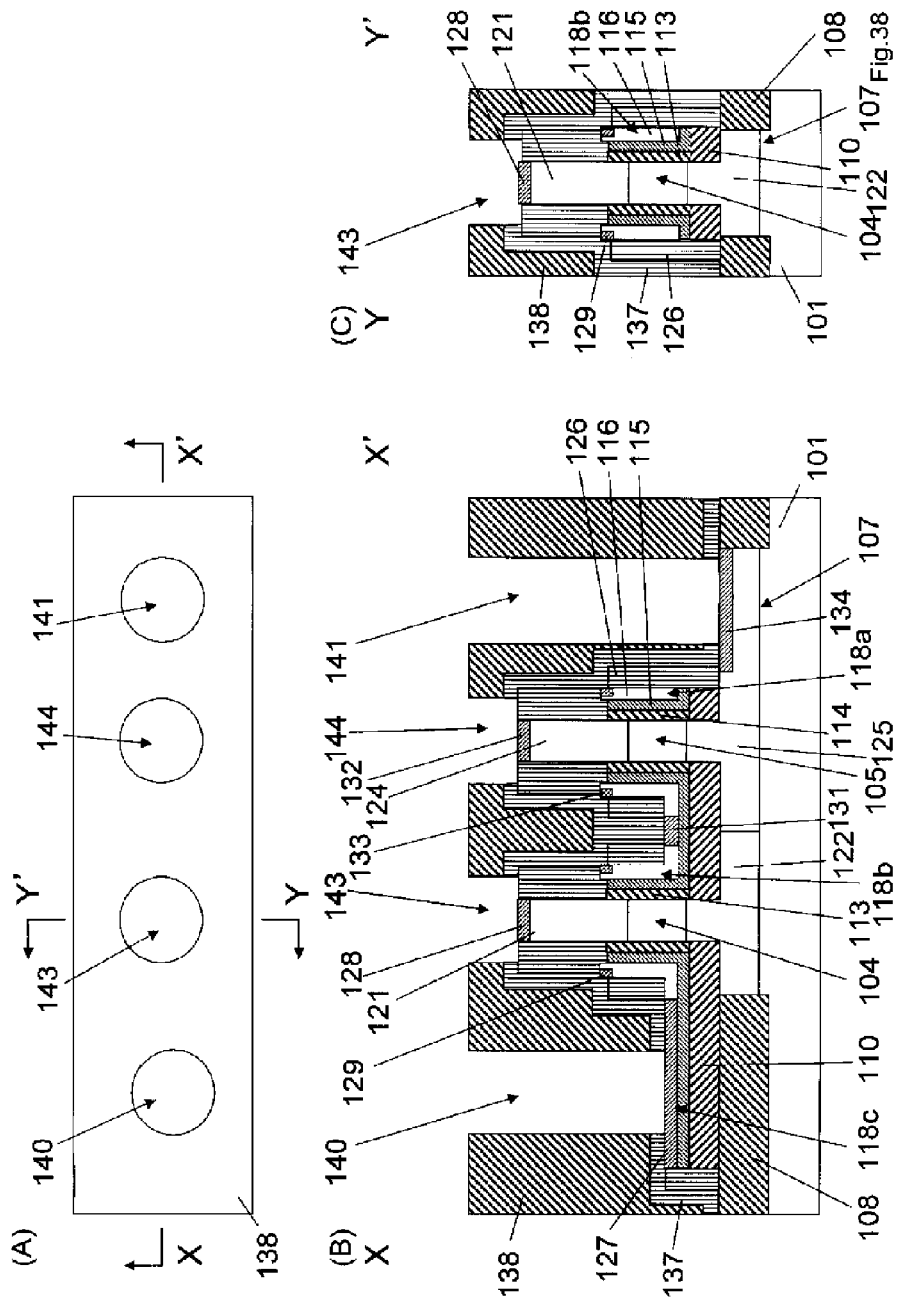

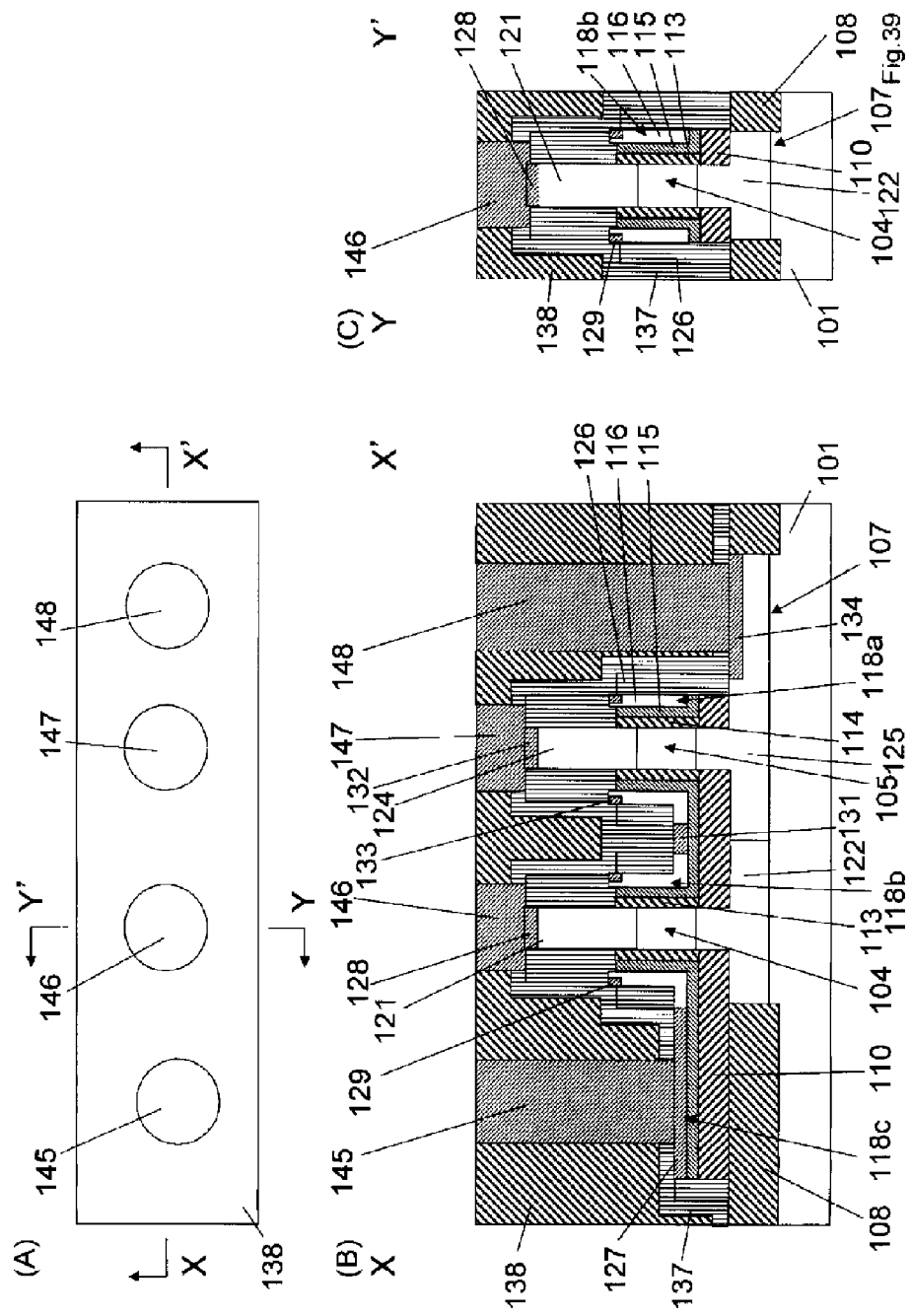

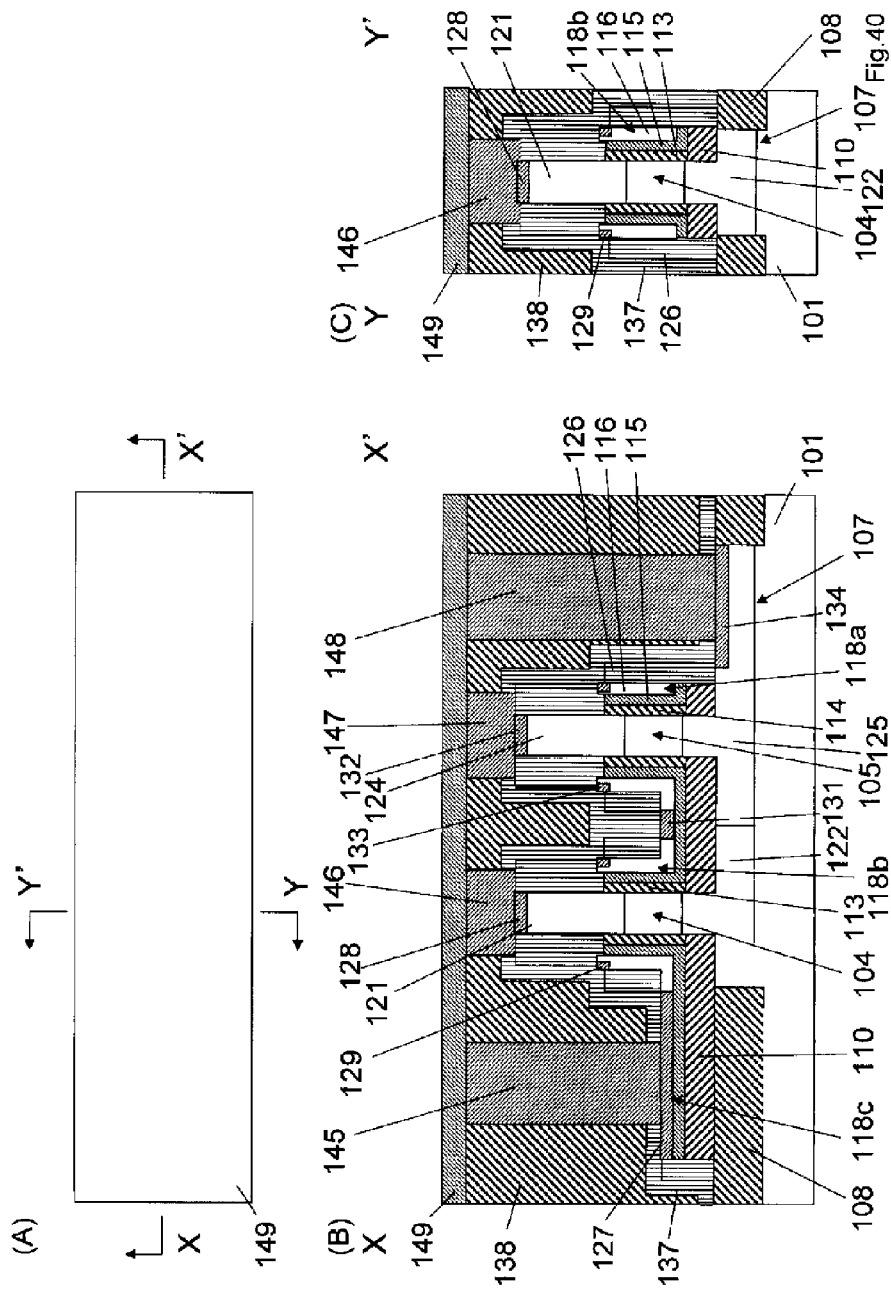

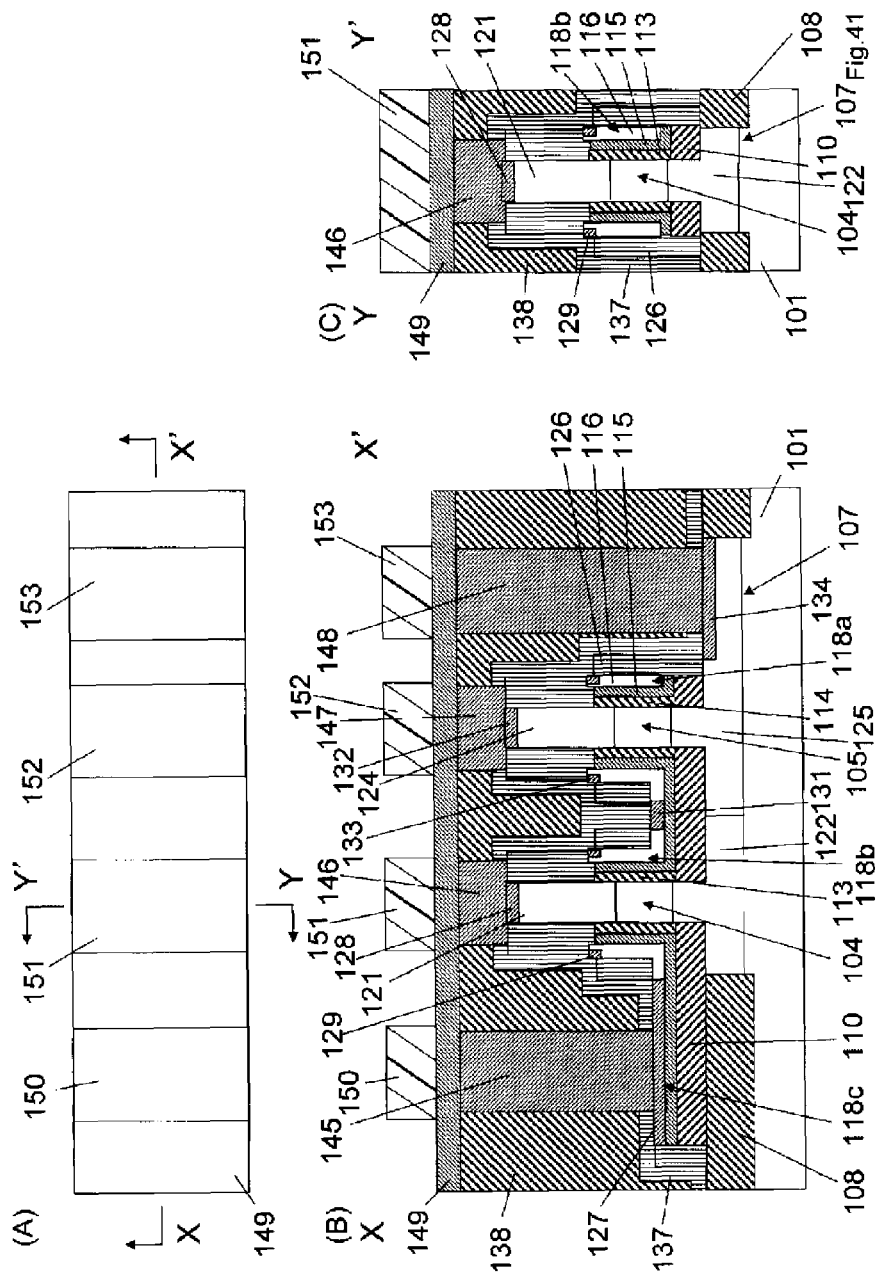

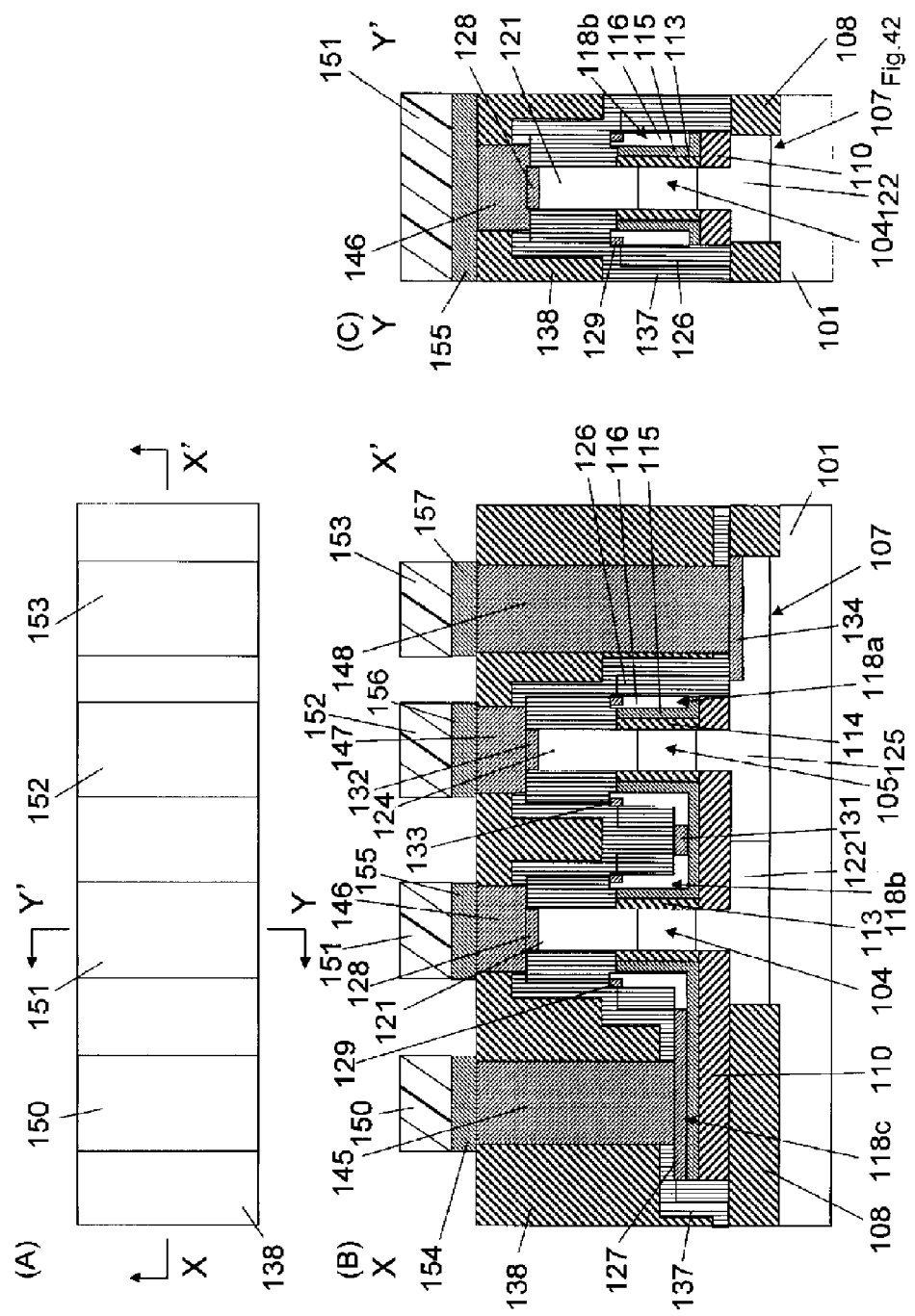

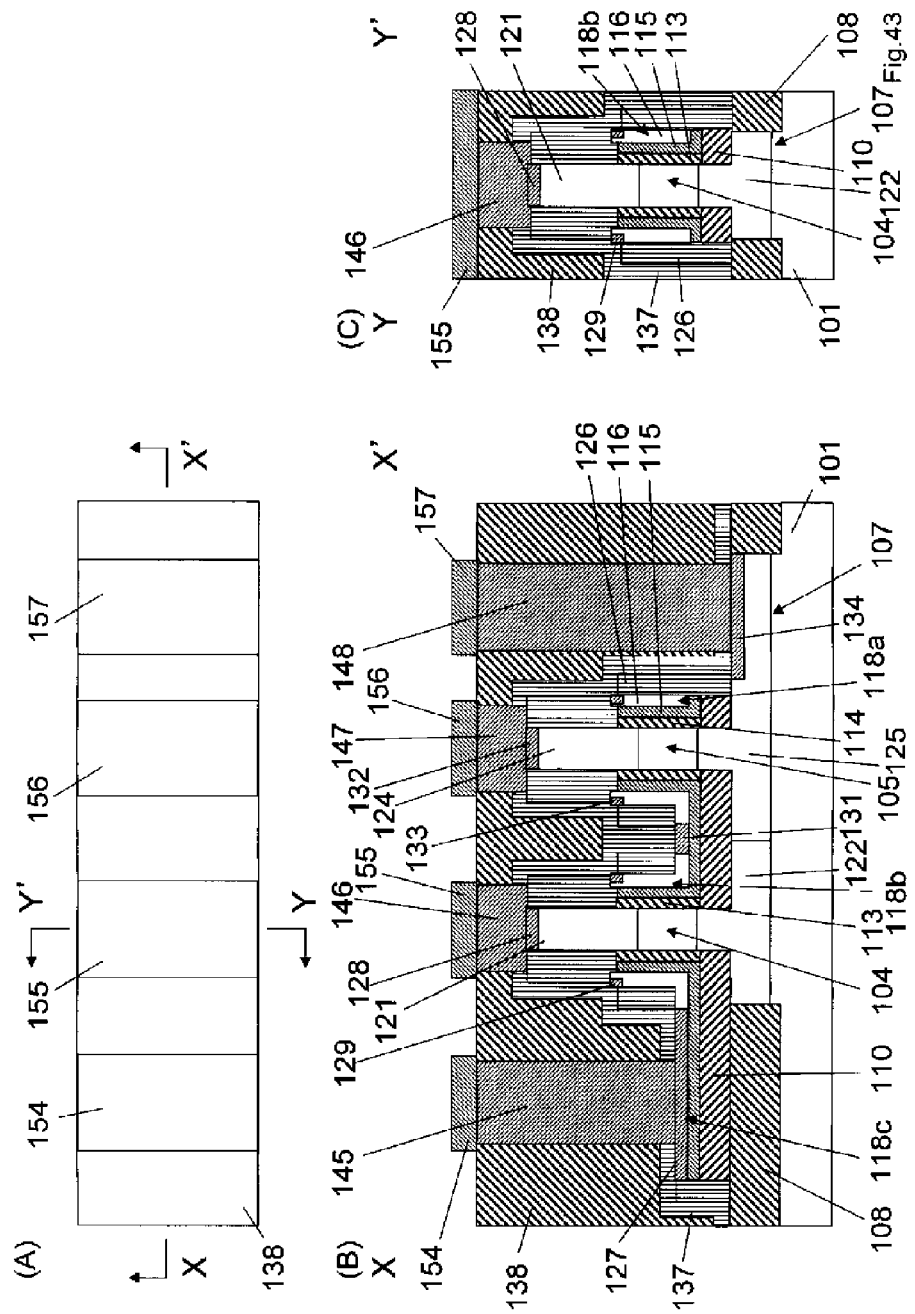

METHOD FOR PRODUCING A SEMICONDUCTOR DEVICE AND SEMICONDUCTOR DEVICE

CROSS-REFERENCE TO RELATED APPLICATION

This application claims the benefit, under 35 U.S.C. §119 (e), of provisional patent application No. 61/706,960, filed Sep. 28, 2012; the prior application is herewith incorporated by reference in its entirety.

BACKGROUND OF THE INVENTION

Field of the Invention

The present invention relates to a method for producing a semiconductor device and a semiconductor device.

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as "SGT") having a structure in which a source, a gate, and a drain are disposed so as to be perpendicular to a substrate and a gate electrode surrounds a pillar-shaped semiconductor layer has been proposed (e.g., refer to Japanese Unexamined Patent Application Publication No. 2-71556, Japanese Unexamined Patent Application Publication No. 2-188966, and Japanese Unexamined Patent Application Publication No. 3-145761).

In an existing method for producing an SGT, a silicon pillar on which a nitride film hard mask is formed in a pillar shape is formed, a diffusion layer is formed in a lower portion of the silicon pillar, a gate material is then deposited, the gate material is then planarized and etched back, and an insulating film sidewall is formed on the side wall of the silicon pillar and the nitride film hard mask. Subsequently, a resist pattern for forming a gate line is formed, the gate material is etched, the nitride film hard mask is then removed, and a diffusion layer is formed in an upper portion of the silicon pillar (e.g., refer to Japanese Unexamined Patent Application Publication No. 2009-182317).

In such a method, when the distance between the silicon pillars is decreased, a thick gate material needs to be deposited between the silicon pillars and thus holes called voids may be formed between the silicon pillars. If voids are formed, holes are made in the gate material after the etching back. When an insulating film is then deposited to form an insulating film sidewall, the insulating film is deposited in the voids. This causes difficulty in gate material processing.

In view of the foregoing, it has been disclosed that a silicon pillar is formed, a gate oxide film is then formed, a thin polysilicon is deposited, a resist that covers an upper portion of the silicon pillar and is used to form a gate line is then formed, a gate line is etched, a thick oxide film is then deposited, the upper portion of the silicon pillar is caused to be exposed, the thin polysilicon on the upper portion of the silicon pillar is removed, and the thick oxide film is removed by wet etching (e.g., refer to B. Yang, K. D. Buddharaju, S. H. G. Teo, N. Singh, G. D. Lo, and D. L. Kwong, "Vertical Silicon-Nanowire Formation and Gate-All-Around MOSFET", IEEE Electron Device Letters, VOL. 29, No. 7, July 2008, pp 791-794).

However, a method in which a metal is used for gate electrodes is not described. In addition, a resist that covers an upper portion of the silicon pillar and is used to form a gate line needs to be formed. Therefore, the upper portion of the silicon pillar needs to be covered and thus such a method is not a self-aligned process.

SUMMARY OF THE INVENTION

It is an object of the present invention to provide a method for producing an SGT in which a thin gate material is used, a metal gate is employed, and a self-aligned process is performed and an SGT structure obtained by the method.

A method for producing a semiconductor device according to the present invention includes a first step including forming a planar silicon layer on a silicon substrate and forming a first pillar-shaped silicon layer and a second pillar-shaped silicon layer on the planar silicon layer; a second step including, after the first step, forming an oxide film hard mask on the first pillar-shaped silicon layer and the second pillar-shaped silicon layer, and forming a second oxide film on the planar silicon layer, the second oxide film being thicker than a gate insulating film; and a third step including, after the second step, forming the gate insulating film around each of the first pillar-shaped silicon layer and the second pillar-shaped silicon layer, forming a metal film and a polysilicon film around the gate insulating film, the polysilicon film having a thickness that is smaller than half of a distance between the first pillar-shaped silicon layer and the second pillar-shaped silicon layer, forming a third resist for forming a gate line, and performing anisotropic etching to form the gate line.

The method includes, after the third step, a fourth step including depositing a fourth resist, exposing a portion of the polysilicon film on an upper side wall of each of the first pillar-shaped silicon layer and the second pillar-shaped silicon layer, removing the exposed portion of the polysilicon film by etching, stripping the fourth resist, and removing the metal film by etching to form a first gate electrode and a second gate electrode that are connected to the gate line.

A thick oxide film is deposited on the first pillar-shaped silicon layer, the second pillar-shaped silicon layer, and the planar silicon layer, a thin oxide film is deposited on side walls of the first pillar-shaped silicon layer and the second pillar-shaped silicon layer; and the oxide films are removed by isotropic etching to form the oxide film hard mask on the first pillar-shaped silicon layer and the second pillar-shaped silicon layer and to form the second oxide film on the planar silicon layer, the second oxide film being thicker than the gate insulating film.

The method further includes a fifth step including forming a first n-type diffusion layer in an upper portion of the first pillar-shaped silicon layer, forming a second n-type diffusion layer in a lower portion of the first pillar-shaped silicon layer and in an upper portion of the planar silicon layer, forming a first p-type diffusion layer in an upper portion of the second pillar-shaped silicon layer, and forming a second p-type diffusion layer in a lower portion of the second pillar-shaped silicon layer and in an upper portion of the planar silicon layer.

The method further includes a sixth step including forming silicides on the first n-type diffusion layer, the second n-type diffusion layer, the first p-type diffusion layer, the second p-type diffusion layer, and the gate line.

A semiconductor device according to the present invention includes a planar silicon layer formed on a silicon substrate; first and second pillar-shaped silicon layers formed on the planar silicon layer; a gate insulating film formed around the first pillar-shaped silicon layer; a first gate electrode having a laminated structure of a metal film and a polysilicon film and formed around the gate insulating film; a gate insulating film formed around the second pillar-shaped silicon layer; a second gate electrode having a laminated structure of a metal film and a polysilicon film and formed around the gate insulating film, the polysilicon film having a thickness that is smaller than half of a distance between the first pillar-shaped silicon layer and the second pillar-shaped silicon layer; a gate line connected to the first and second gate electrodes, the gate line having an upper surface located lower than upper surfaces of the first and second gate electrodes; a second oxide film formed between the gate line and the planar silicon layer, the second oxide film being thicker than the gate insulating films; a first n-type diffusion layer formed in an upper portion of the first pillar-shaped silicon layer; a second n-type diffusion layer formed in a lower portion of the first pillar-shaped silicon layer and in an upper portion of the planar silicon layer; a first p-type diffusion layer formed in an upper portion of the second pillar-shaped silicon layer; and a second p-type diffusion layer formed in a lower portion of the second pillar-shaped silicon layer and in an upper portion of the planar silicon layer.

The gate line has a laminated structure of the metal film and a silicide.

A center line of the gate line is displaced from a line that connects a center point of the first pillar-shaped silicon layer to a center point of the second pillar-shaped silicon layer by a first predetermined distance.

The semiconductor device includes silicides formed on the first and second n-type diffusion layers and the first and second p-type diffusion layers.

According to the present invention, there can be provided a method for producing an SGT in which a thin gate material is used, a metal gate is employed, and a self-aligned process is performed and an SGT structure obtained by the method.

The self-aligned process is achieved by, after the first step, forming an oxide film hard mask on the first pillar-shaped silicon layer and the second pillar-shaped silicon layer; a third step including forming a gate insulating film around each of the first pillar-shaped silicon layer and the second pillar-shaped silicon layer, forming a metal film and a polysilicon film around the gate insulating film, the polysilicon film having a thickness that is smaller than half of a distance between the first pillar-shaped silicon layer and the second pillar-shaped silicon layer, forming a third resist for forming a gate line, and performing anisotropic etching to form the gate line; and, after the third step, a fourth step including depositing a fourth resist, exposing a portion of the polysilicon film on an upper side wall of each of the first pillar-shaped silicon layer and the second pillar-shaped silicon layer, removing the exposed portion of the polysilicon film by etching, stripping the fourth resist, and removing the metal film by etching to form a first gate electrode and a second gate electrode that are connected to the gate line. Such a self-aligned process allows high degree of integration.

In particular, the oxide film hard mask protects the upper portions of silicon pillars during formation of the gate line to thereby achieve the self-aligned process.

By forming a second oxide film between the gate line and the planar silicon layer, the second oxide film being thicker than the gate insulating films, capacitance between the gate line and the substrate can be decreased. In addition, insulation between the gate line and the substrate can be ensured with more certainty.

The gate line has a laminated structure of the metal film and a silicide. A direct contact between the silicide and the metal film allows a decrease in the resistance.

A center line of the gate line is displaced from a line that connects a center point of the first pillar-shaped silicon layer to a center point of the second pillar-shaped silicon layer by a first predetermined distance. A silicide that connects the second n-type diffusion layer to the second p-type diffusion layer is easily formed, which allows high degree of integration.

Other features which are considered as characteristic for the invention are set forth in the appended claims.

Although the invention is illustrated and described herein as embodied in method for producing semiconductor device and semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 37(A) is a plan view showing a method for producing a semiconductor device according to this embodiment.

FIG. 37(B) is a sectional view taken along line X-X' of FIG. 37(A).

FIG. 37(C) is a sectional view taken along line Y-Y' of FIG. 37(A).

FIG. 38(A) is a plan view showing a method for producing a semiconductor device according to this embodiment.

FIG. 38(B) is a sectional view taken along line X-X' of FIG. 38(A).

FIG. 38(C) is a sectional view taken along line Y-Y' of FIG. 38(A).

FIG. 39(A) is a plan view showing a method for producing a semiconductor device according to this embodiment.

FIG. 39(B) is a sectional view taken along line X-X' of FIG. 39(A).

FIG. 39(C) is a sectional view taken along line Y-Y' of FIG. 39(A).

FIG. 40(A) is a plan view showing a method for producing a semiconductor device according to this embodiment.

FIG. 40(B) is a sectional view taken along line X-X' of FIG. 40(A).

FIG. 40(C) is a sectional view taken along line Y-Y' of FIG. 40(A).

FIG. 41(A) is a plan view showing a method for producing a semiconductor device according to this embodiment.

FIG. 41(B) is a sectional view taken along line X-X' of FIG. 41(A).

FIG. 41(C) is a sectional view taken along line Y-Y' of FIG. 41(A).

FIG. 42(A) is a plan view showing a method for producing a semiconductor device according to this embodiment.

FIG. 42(B) is a sectional view taken along line X-X' of FIG. 42(A).

FIG. 42(C) is a sectional view taken along line Y-Y' of FIG. 42(A).

FIG. 43(A) is a plan view showing a method for producing a semiconductor device according to this embodiment.

FIG. 43(B) is a sectional view taken along line X-X' of FIG. 43(A).

FIG. 43(C) is a sectional view taken along line Y-Y' of FIG. 43(A).

DETAILED DESCRIPTION OF THE INVENTION

Hereinafter, referring to FIGS. 2 to 43, a production process of a semiconductor device having an SGT structure according to an embodiment of the present invention will be described.

Hereafter, a first step will be described that includes forming a planar silicon layer on a silicon substrate and forming a first pillar-shaped silicon layer and a second pillar-shaped silicon layer on the planar silicon layer.

Figure 2:
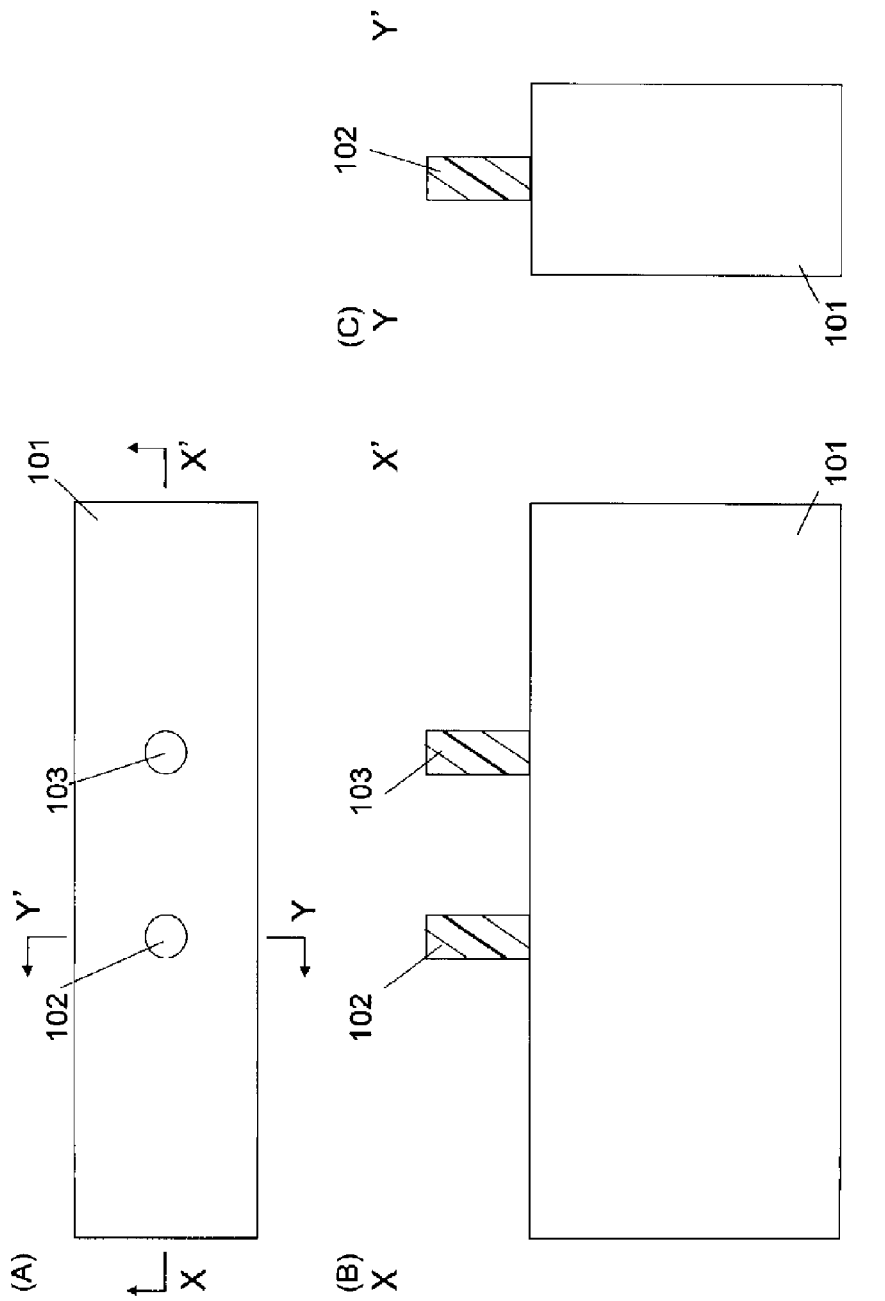
FIG. 2(A) is a plan view showing a method for producing a semiconductor device according to this embodiment.
FIG. 2(B) is a sectional view taken along line X-X' of FIG. 2(A).
FIG. 2(C) is a sectional view taken along line Y-Y' of FIG. 2(A).

As illustrated in FIG. 2, on a silicon substrate 101, first resists 102 and 103 for forming a first pillar-shaped silicon layer 104 and a second pillar-shaped silicon layer 105 are formed.

Figure 3:
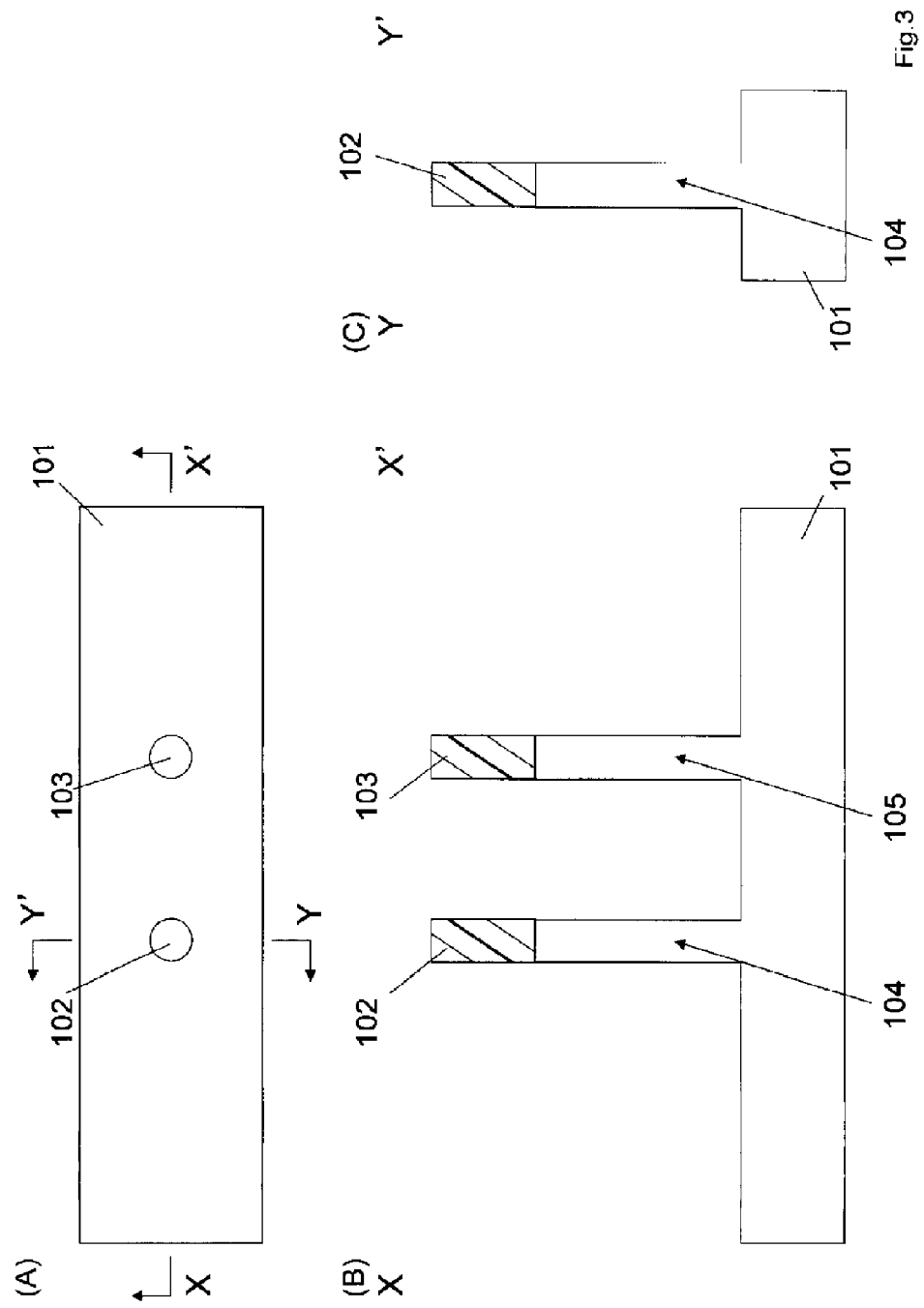
FIG. 3(A) is a plan view showing a method for producing a semiconductor device according to this embodiment.
FIG. 3(B) is a sectional view taken along line X-X' of FIG. 3(A).
FIG. 3(C) is a sectional view taken along line Y-Y' of FIG. 3(A).

As illustrated in FIG. 3, the silicon substrate 101 is etched to form the first pillar-shaped silicon layer 104 and the second pillar-shaped silicon layer 105. Since the resists are used to form the pillar-shaped silicon layers, the number of steps can be decreased, compared with a process using a hard mask.

Figure 4:
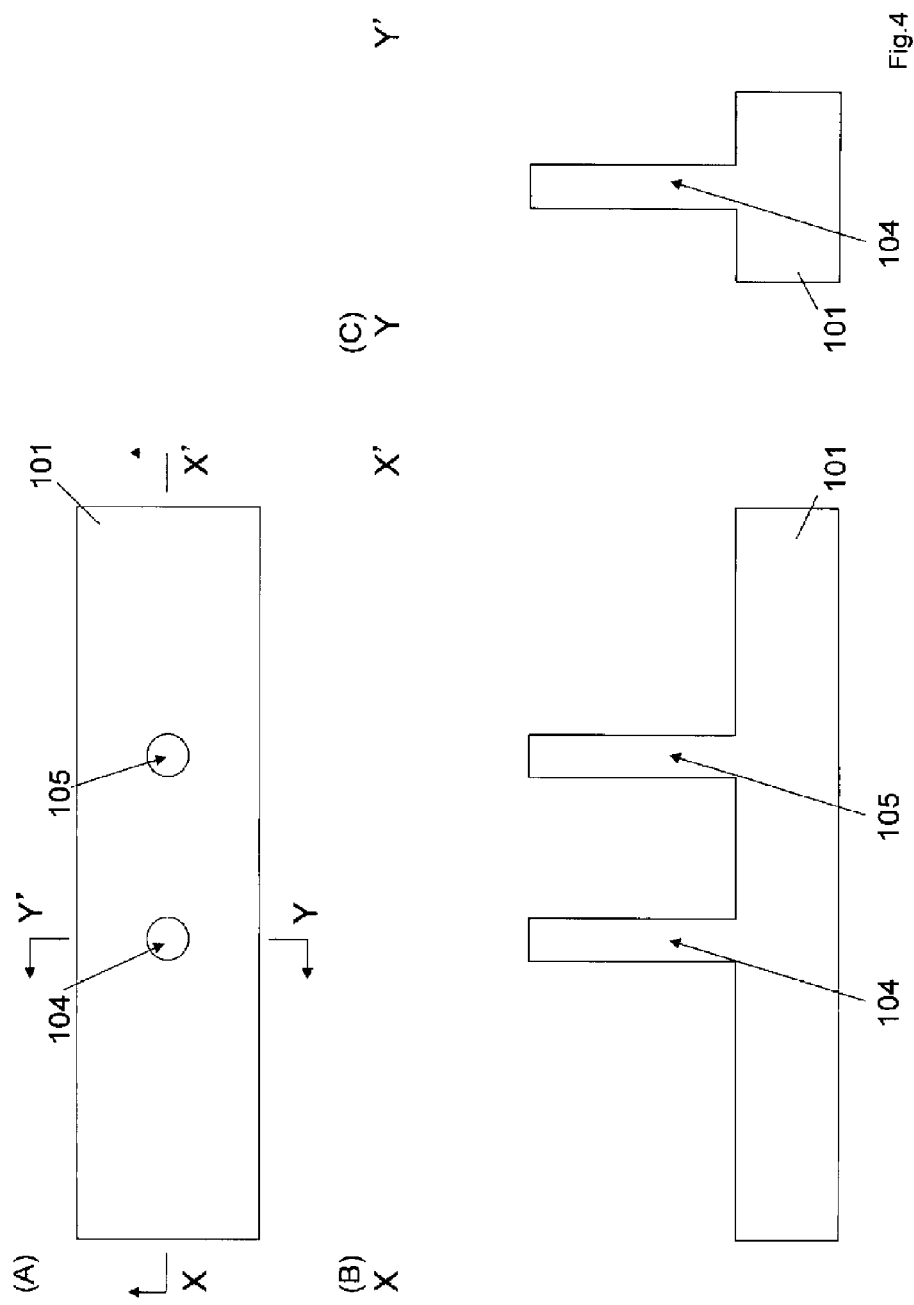
FIG. 4(A) is a plan view showing a method for producing a semiconductor device according to this embodiment.
FIG. 4(B) is a sectional view taken along line X-X' of FIG. 4(A).
FIG. 4(C) is a sectional view taken along line Y-Y' of FIG. 4(A).

As illustrated in FIG. 4, the first resists 102 and 103 are stripped.

Figure 5:
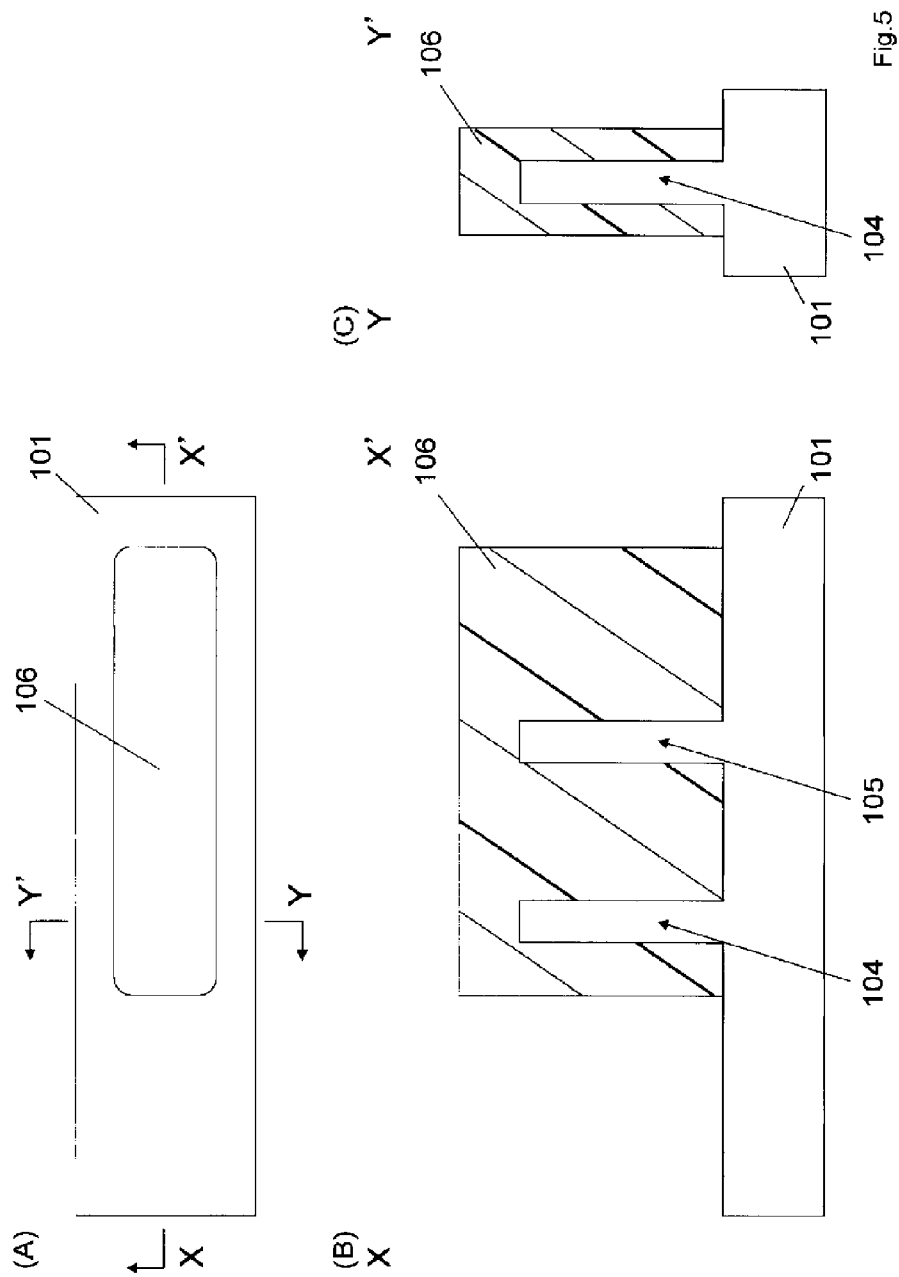
FIG. 5(A) is a plan view showing a method for producing a semiconductor device according to this embodiment.
FIG. 5(B) is a sectional view taken along line X-X' of FIG. 5(A).
FIG. 5(C) is a sectional view taken along line Y-Y' of FIG. 5(A).

As illustrated in FIG. 5, a second resist 106 for forming a planar silicon layer 107 is formed.

Figure 6:
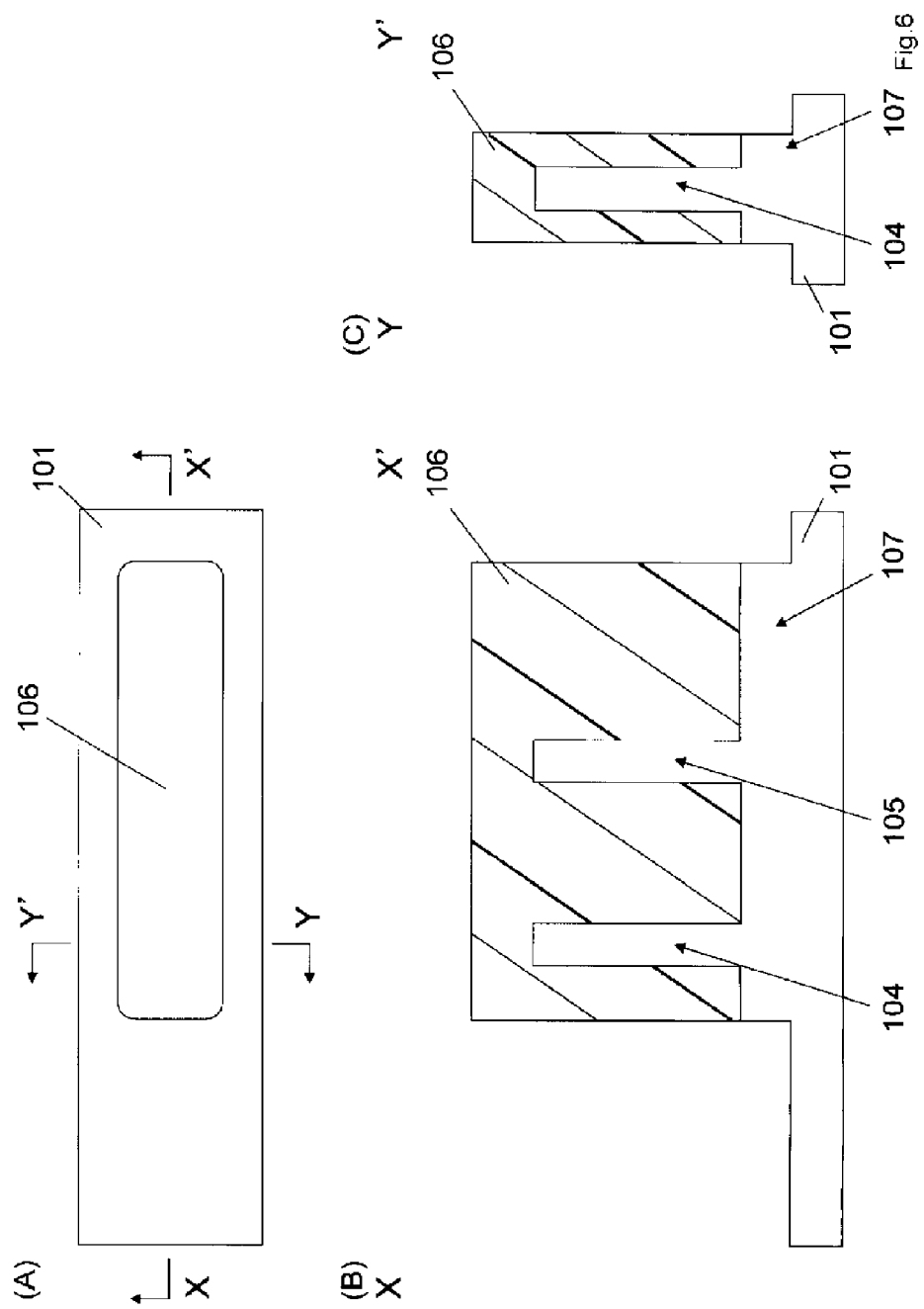
FIG. 6(A) is a plan view showing a method for producing a semiconductor device according to this embodiment.
FIG. 6(B) is a sectional view taken along line X-X' of FIG. 6(A).
FIG. 6(C) is a sectional view taken along line Y-Y' of FIG. 6(A).

As illustrated in FIG. 6, the silicon substrate 101 is etched to form the planar silicon layer 107.

Figure 7:
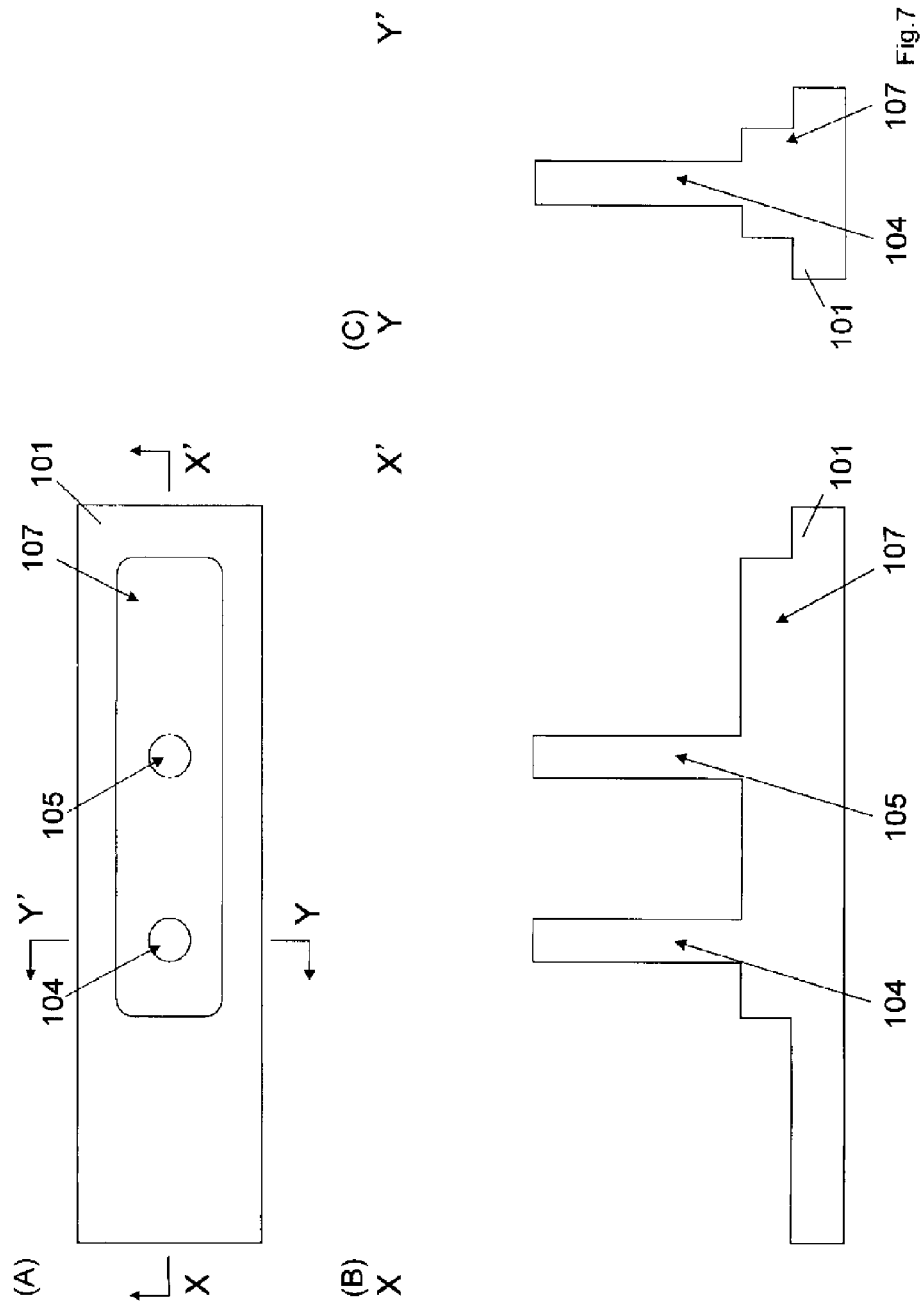
FIG. 7(A) is a plan view showing a method for producing a semiconductor device according to this embodiment.
FIG. 7(B) is a sectional view taken along line X-X' of FIG. 7(A).
FIG. 7(C) is a sectional view taken along line Y-Y' of FIG. 7(A).

As illustrated in FIG. 7, the second resist 106 is stripped.

Figure 8:
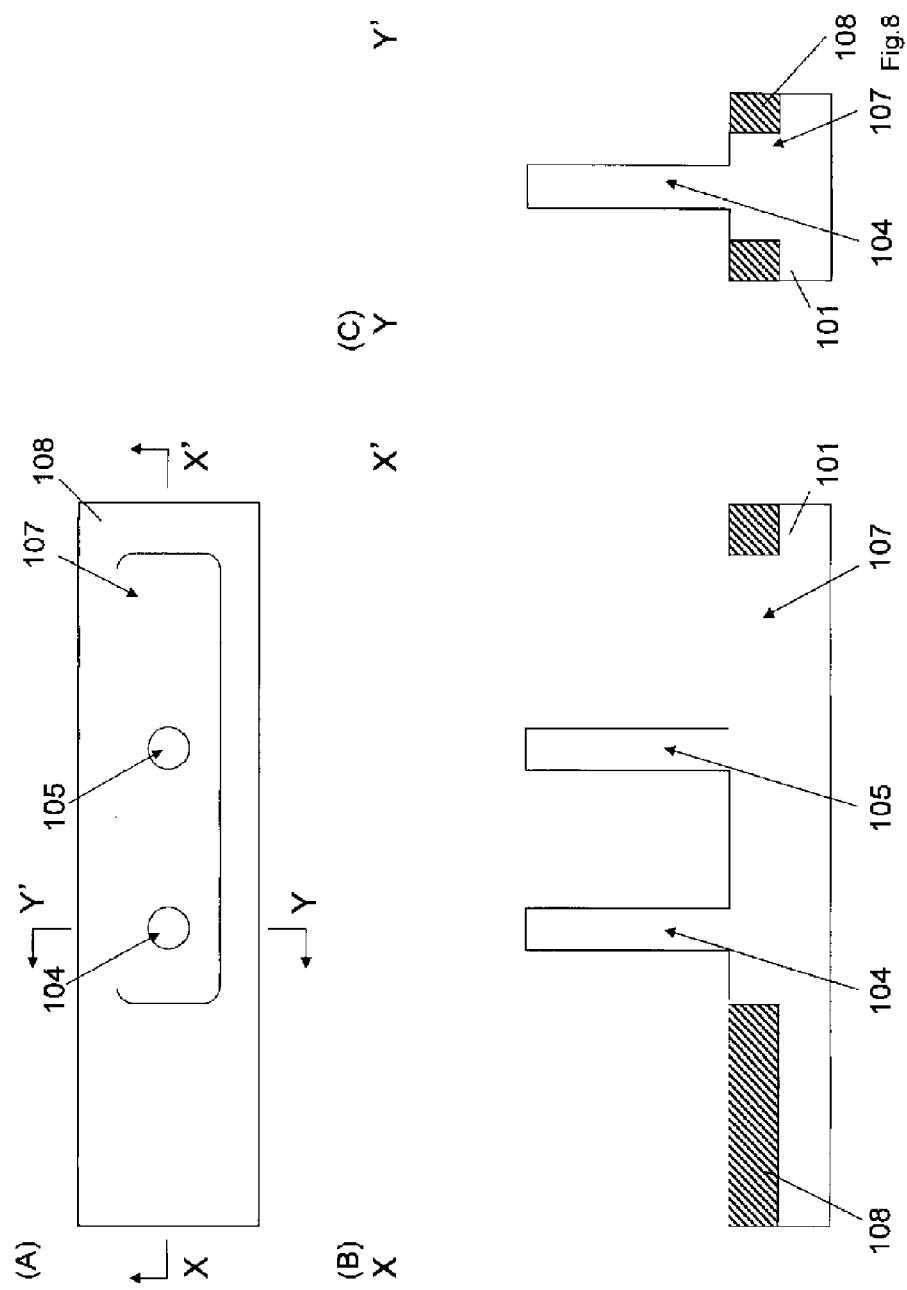
FIG. 8(A) is a plan view showing a method for producing a semiconductor device according to this embodiment.
FIG. 8(B) is a sectional view taken along line X-X' of FIG. 8(A).
FIG. 8(C) is a sectional view taken along line Y-Y' of FIG. 8(A).

As illustrated in FIG. 8, an element separation film 108 is formed around the planar silicon layer 107.

Thus, the first step has been described that includes forming the planar silicon layer 107 on the silicon substrate 101 and forming the first pillar-shaped silicon layer 104 and the second pillar-shaped silicon layer 105 on the planar silicon layer 107.

Hereafter, a second step will be described that includes forming an oxide film hard mask on the first pillar-shaped silicon layer and the second pillar-shaped silicon layer, and forming a second oxide film on the planar silicon layer, the second oxide film being thicker than a gate insulating film.

Figure 9:
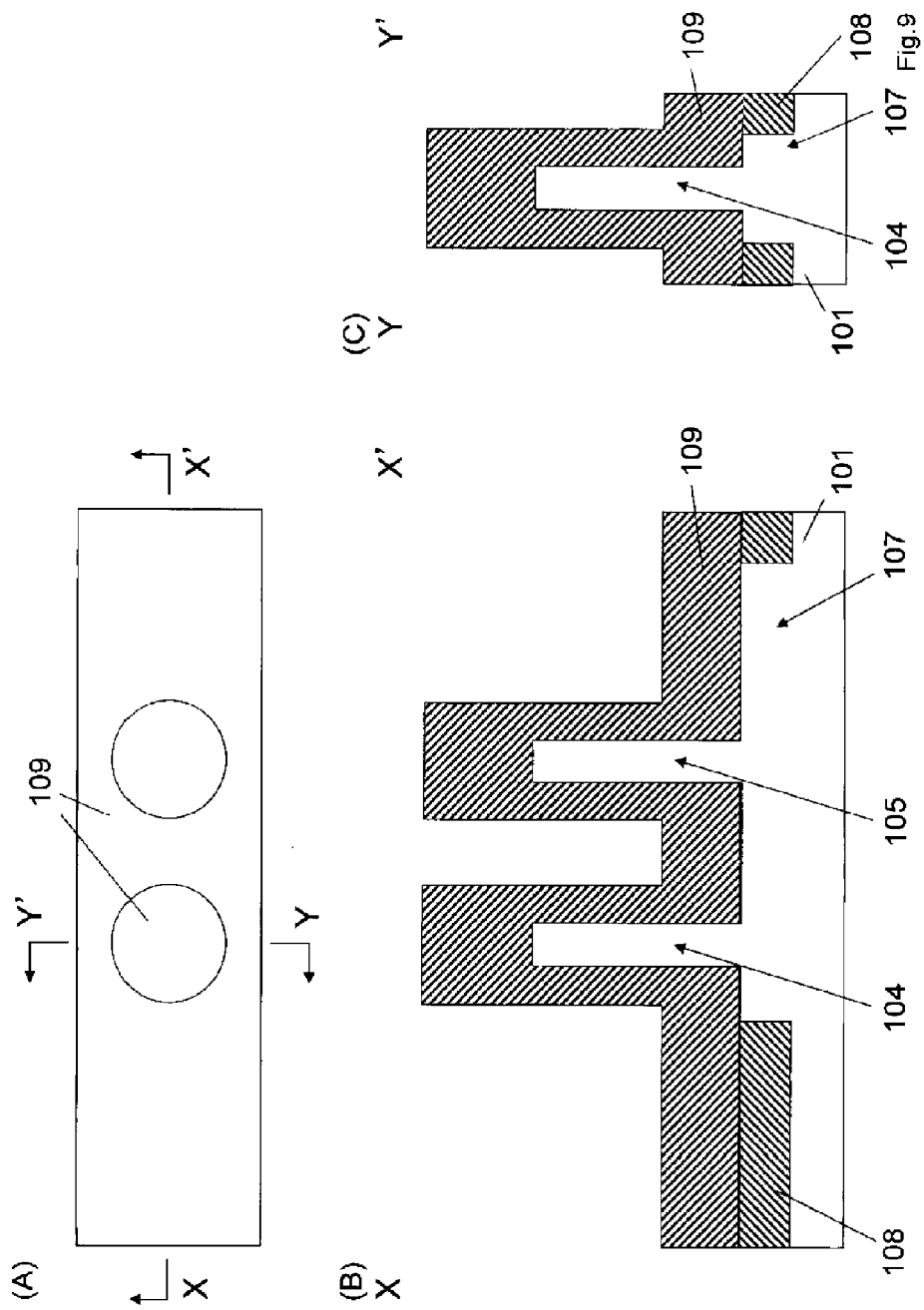
FIG. 9(A) is a plan view showing a method for producing a semiconductor device according to this embodiment.
FIG. 9(B) is a sectional view taken along line X-X' of FIG. 9(A).
FIG. 9(C) is a sectional view taken along line Y-Y' of FIG. 9(A).

As illustrated in FIG. 9, an oxide film 109 is deposited so as to cover the first pillar-shaped silicon layer 104, the second pillar-shaped silicon layer 105, and the planar silicon layer 107. This deposition is preferably performed by atmospheric pressure CVD (chemical vapor deposition). Employment of deposition by atmospheric pressure CVD allows deposition of a thick oxide film on the first pillar-shaped silicon layer 104, the second pillar-shaped silicon layer 105, and the planar silicon layer 107, and deposition of a thin oxide film on the side walls of the first pillar-shaped silicon layer 104 and the second pillar-shaped silicon layer 105. In addition, the oxide film on the first pillar-shaped silicon layer 104 and the second pillar-shaped silicon layer 105 can be deposited so as to be thicker than the oxide film deposited on the planar silicon layer 107.

Figure 10:
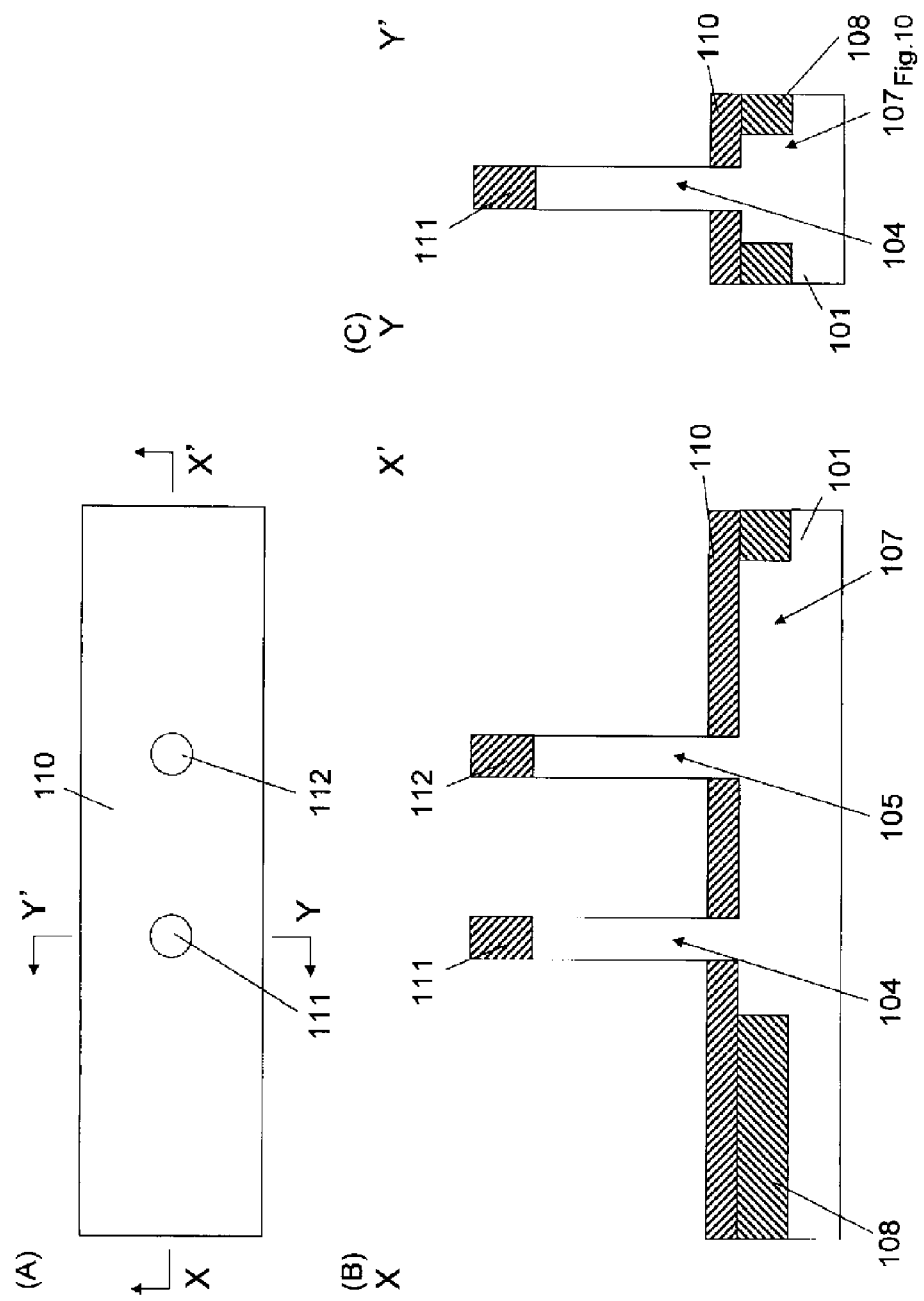
FIG. 10(A) is a plan view showing a method for producing a semiconductor device according to this embodiment.
FIG. 10(B) is a sectional view taken along line X-X' of FIG. 10(A).
FIG. 10(C) is a sectional view taken along line Y-Y' of FIG. 10(A).

As illustrated in FIG. 10, the oxide film 109 is removed by isotropic etching to form oxide film hard masks 111 and 112 on the first pillar-shaped silicon layer 104 and the second pillar-shaped silicon layer 105 and to form a second oxide film 110 on the planar silicon layer 107, the second oxide film 110 being thicker than the gate insulating film.

Thus, the second step has been described that includes forming an oxide film hard mask on the first pillar-shaped silicon layer and the second pillar-shaped silicon layer, and forming a second oxide film on the planar silicon layer, the second oxide film being thicker than a gate insulating film.

Hereafter, a third step will be described that includes forming the gate insulating film around each of the first pillar-shaped silicon layer and the second pillar-shaped silicon layer, forming a metal film and a polysilicon film around the gate insulating film, the polysilicon film having a thickness that is smaller than half of a distance between the first pillar-shaped silicon layer and the second pillar-shaped silicon layer, forming a third resist for forming a gate line, and performing anisotropic etching to form the gate line.

Figure 11:
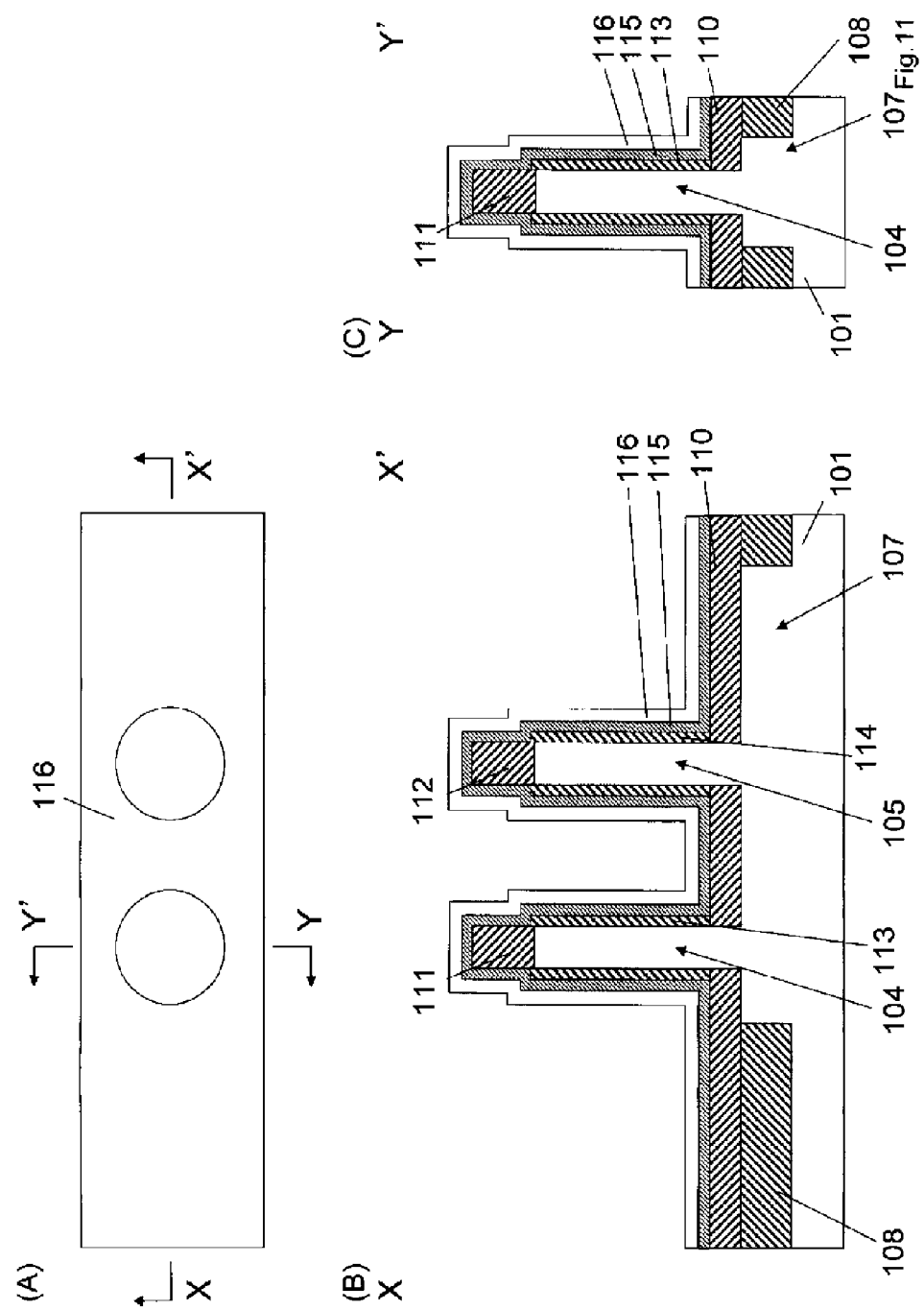
FIG. 11(A) is a plan view showing a method for producing a semiconductor device according to this embodiment.
FIG. 11(B) is a sectional view taken along line X-X' of FIG. 11(A).
FIG. 11(C) is a sectional view taken along line Y-Y' of FIG. 11(A).

As illustrated in FIG. 11, gate insulating films 113 and 114 are formed around the first pillar-shaped silicon layer 104 and the second pillar-shaped silicon layer 105; and a metal film 115 and a polysilicon film 116 are formed around the gate insulating films 113 and 114. Accordingly, formation of voids in the polysilicon film 116 can be suppressed. The metal film 115 may be formed of any metal that is used in a semiconductor process and sets the threshold voltage of a transistor, such as titanium nitride. The gate insulating films 113 and 114 may be any films that are used in a semiconductor process, such as, oxide films, oxynitride films, and high-dielectric films.

Figure 12:
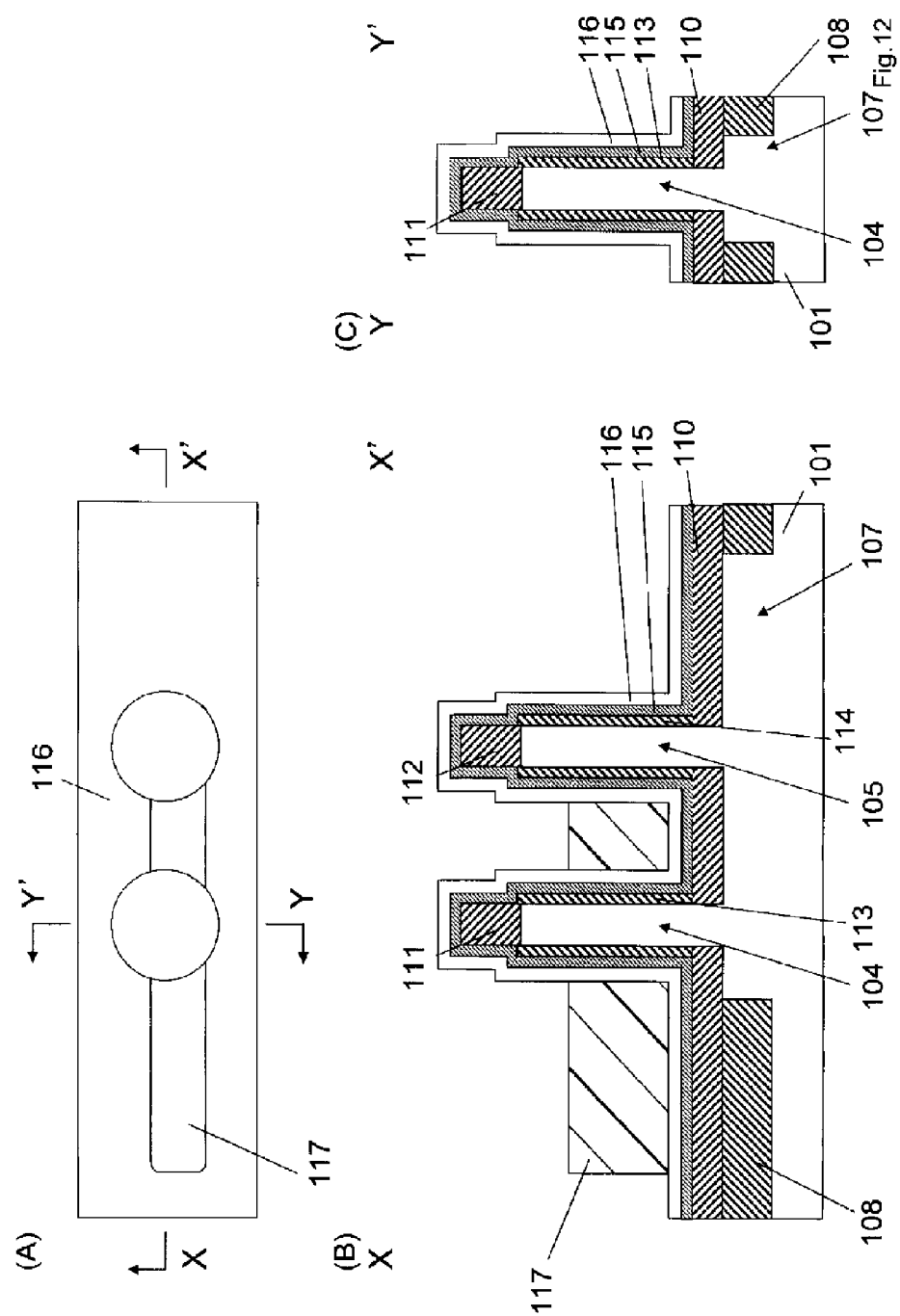
FIG. 12(A) is a plan view showing a method for producing a semiconductor device according to this embodiment.
FIG. 12(B) is a sectional view taken along line X-X' of FIG. 12(A).
FIG. 12(C) is a sectional view taken along line Y-Y' of FIG. 12(A).

As illustrated in FIG. 12, a third resist 117 for forming a gate line is formed. In this embodiment, the resist is illustrated such that its top is located lower than the pillar-shaped silicon layers. This is because, when the pillar-shaped silicon layers have a large height, the thickness of the resist on upper portions of the pillar-shaped silicon layers may be small or the polysilicon on upper portions of the pillar-shaped silicon layers may be exposed. The narrower the gate-line width, the higher the probability of exposure of the polysilicon on the upper portions of the pillar-shaped silicon layers. The resist may be formed such that its top is located higher than the pillar-shaped silicon layers.

In addition, in this case, the third resist 117 is preferably formed such that the center line of the third resist 117 for the gate line is displaced from a line that connects the center point of the first pillar-shaped silicon layer 104 to the center point of the second pillar-shaped silicon layer 105. This is because a silicide that connects a second n-type diffusion layer to a second p-type diffusion layer is easily formed.

Figure 13:
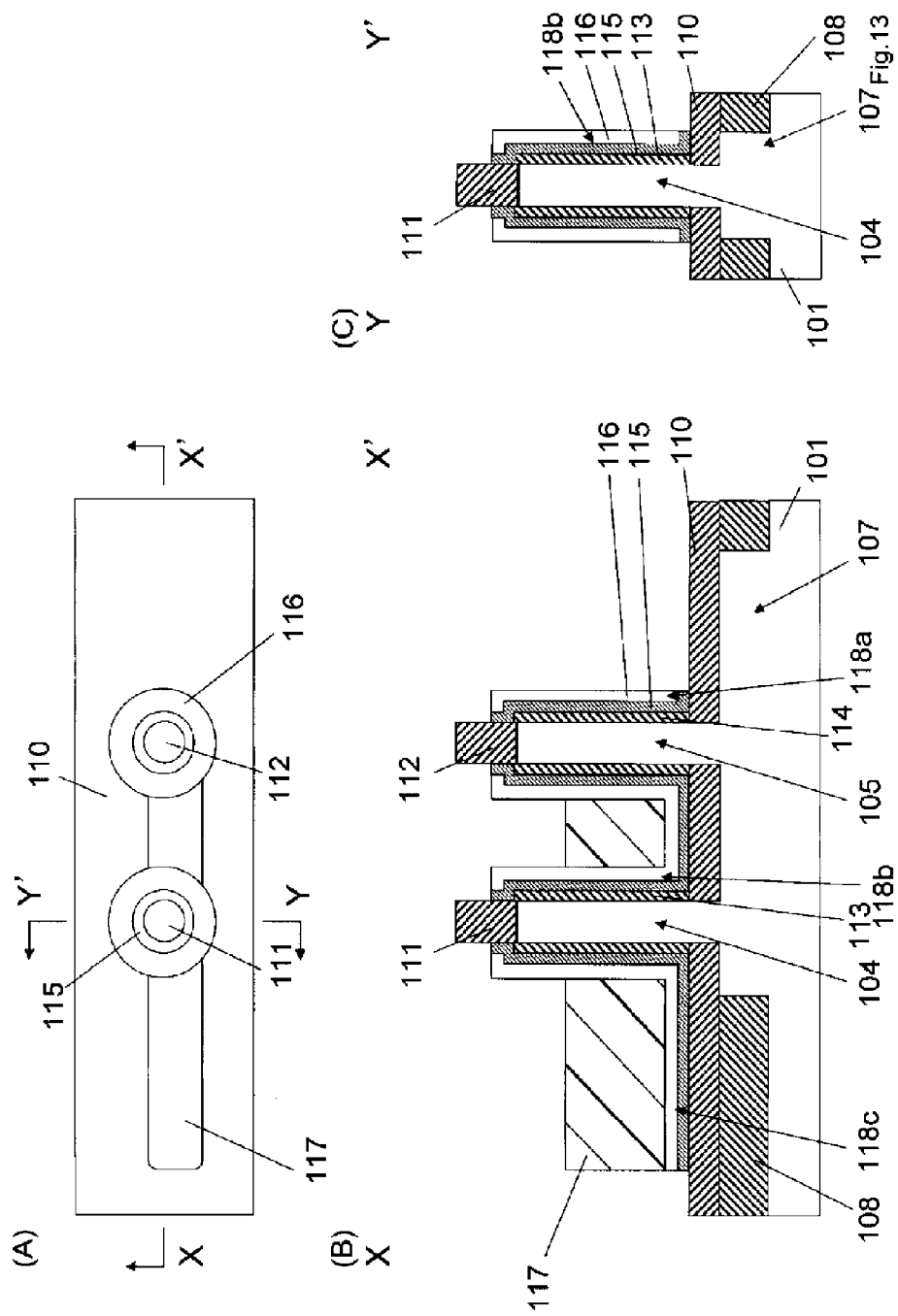
FIG. 13(A) is a plan view showing a method for producing a semiconductor device according to this embodiment.
FIG. 13(B) is a sectional view taken along line X-X' of FIG. 13(A).
FIG. 13(C) is a sectional view taken along line Y-Y' of FIG. 13(A).

As illustrated in FIG. 13, the polysilicon film 116 and the metal film 115 are etched to form gate electrodes 118a and 118b and a gate line 118c. In this case, even when the thickness of the resist on upper portions of the pillar-shaped silicon layers is small or the polysilicon on upper portions of the pillar-shaped silicon layers is exposed, the upper portions of the pillar-shaped silicon layers are protected by the oxide film hard masks 111 and 112.

Figure 14:
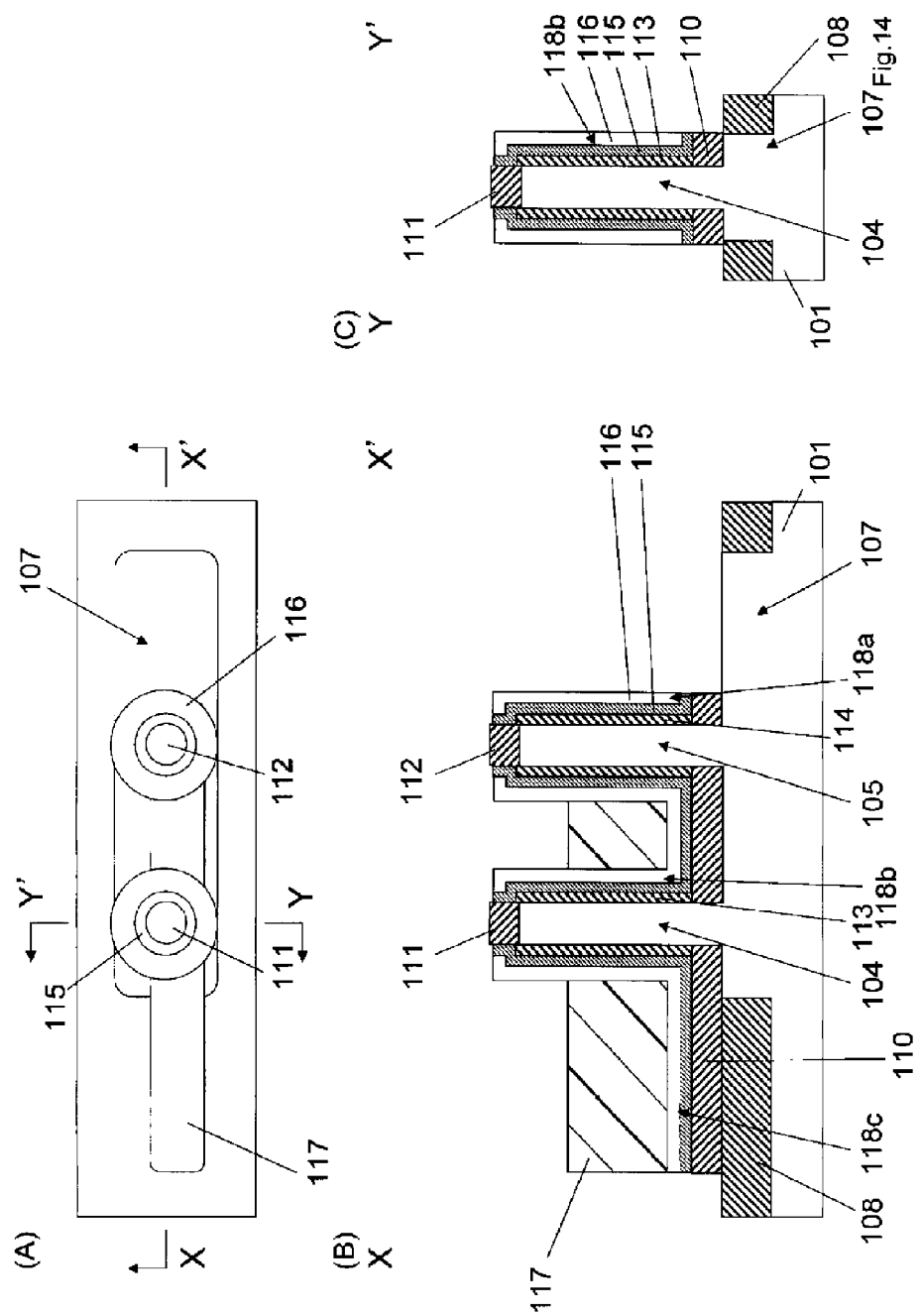
FIG. 14(A) is a plan view showing a method for producing a semiconductor device according to this embodiment.
FIG. 14(B) is a sectional view taken along line X-X' of FIG. 14(A).
FIG. 14(C) is a sectional view taken along line Y-Y' of FIG. 14(A).

As illustrated in FIG. 14, the second oxide film 110 is etched. At this time, the oxide film hard masks 111 and 112 are also etched. However, since the thickness of the oxide films deposited on the first pillar-shaped silicon layer 104 and the second pillar-shaped silicon layer 105 is larger than the thickness of the oxide film deposited on the planar silicon layer 107, the oxide film hard masks 111 and 112 are left. When the oxide film hard masks 111 and 112 are not left, in a subsequent step, the silicon pillars will be etched during removal of the polysilicon film. In this case, the height of the polysilicon film exposed is preferably increased by the height of the silicon pillars that is decreased by etching. Alternatively, the second oxide film 110 may be etched after the fourth step.

Figure 15:
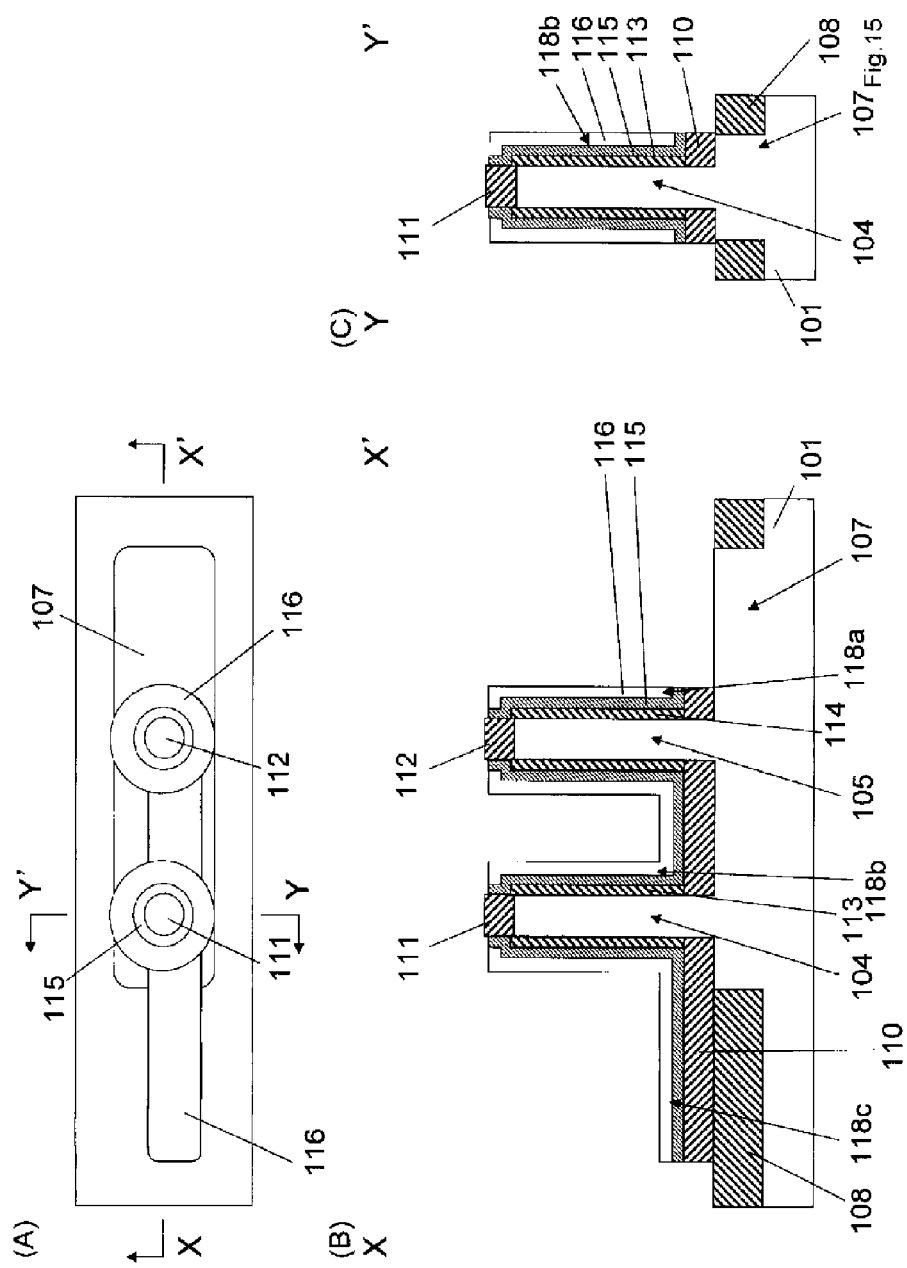
FIG. 15(A) is a plan view showing a method for producing a semiconductor device according to this embodiment.
FIG. 15(B) is a sectional view taken along line X-X' of FIG. 15(A).
FIG. 15(C) is a sectional view taken along line Y-Y' of FIG. 15(A).

As illustrated in FIG. 15, the third resist 117 is stripped.

Thus, the third step has been described that includes forming a gate insulating film around each of the first pillar-shaped silicon layer and the second pillar-shaped silicon layer, forming a metal film and a polysilicon film around the gate insulating film, the polysilicon film having a thickness that is smaller than half of a distance between the first pillar-shaped silicon layer and the second pillar-shaped silicon layer, forming a third resist for forming a gate line, and performing anisotropic etching to form the gate line.

Hereafter, a fourth step will be described that includes depositing a fourth resist, exposing a portion of the polysilicon film on an upper side wall of each of the first pillar-shaped silicon layer and the second pillar-shaped silicon layer, removing the exposed portion of the polysilicon film by etching, stripping the fourth resist, and removing the metal film by etching to form a first gate electrode and a second gate electrode that are connected to the gate line.

Figure 16:
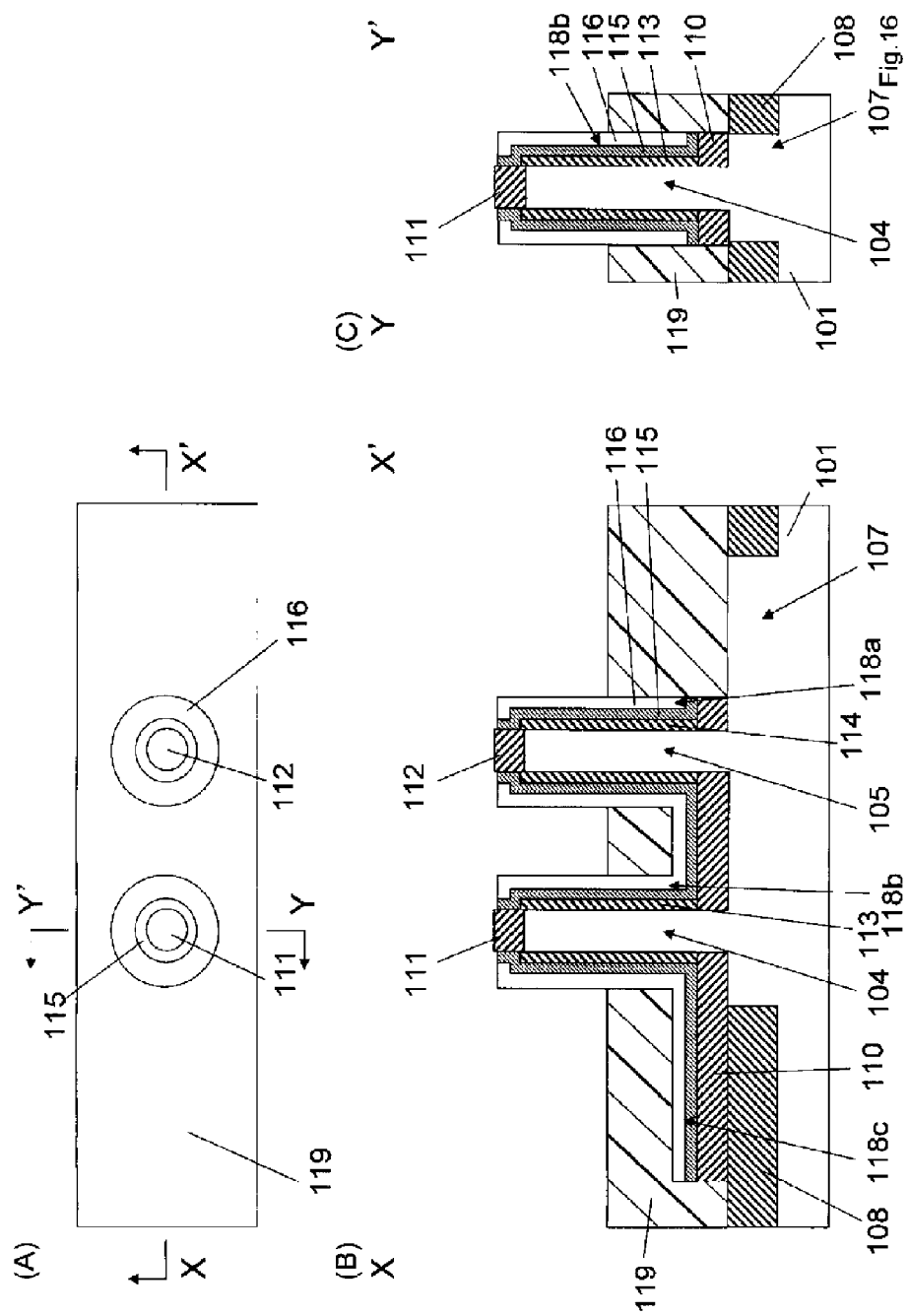
FIG. 16(A) is a plan view showing a method for producing a semiconductor device according to this embodiment.
FIG. 16(B) is a sectional view taken along line X-X' of FIG. 16(A).
FIG. 16(C) is a sectional view taken along line Y-Y' of FIG. 16(A).

As illustrated in FIG. 16, a fourth resist 119 is deposited; and portions of the polysilicon film 116 on upper side walls of the first pillar-shaped silicon layer 104 and the second pillar-shaped silicon layer 105 are exposed, which is preferably achieved by resist etch back. Alternatively, a spin-on-glass coating film may be used.

Figure 17:
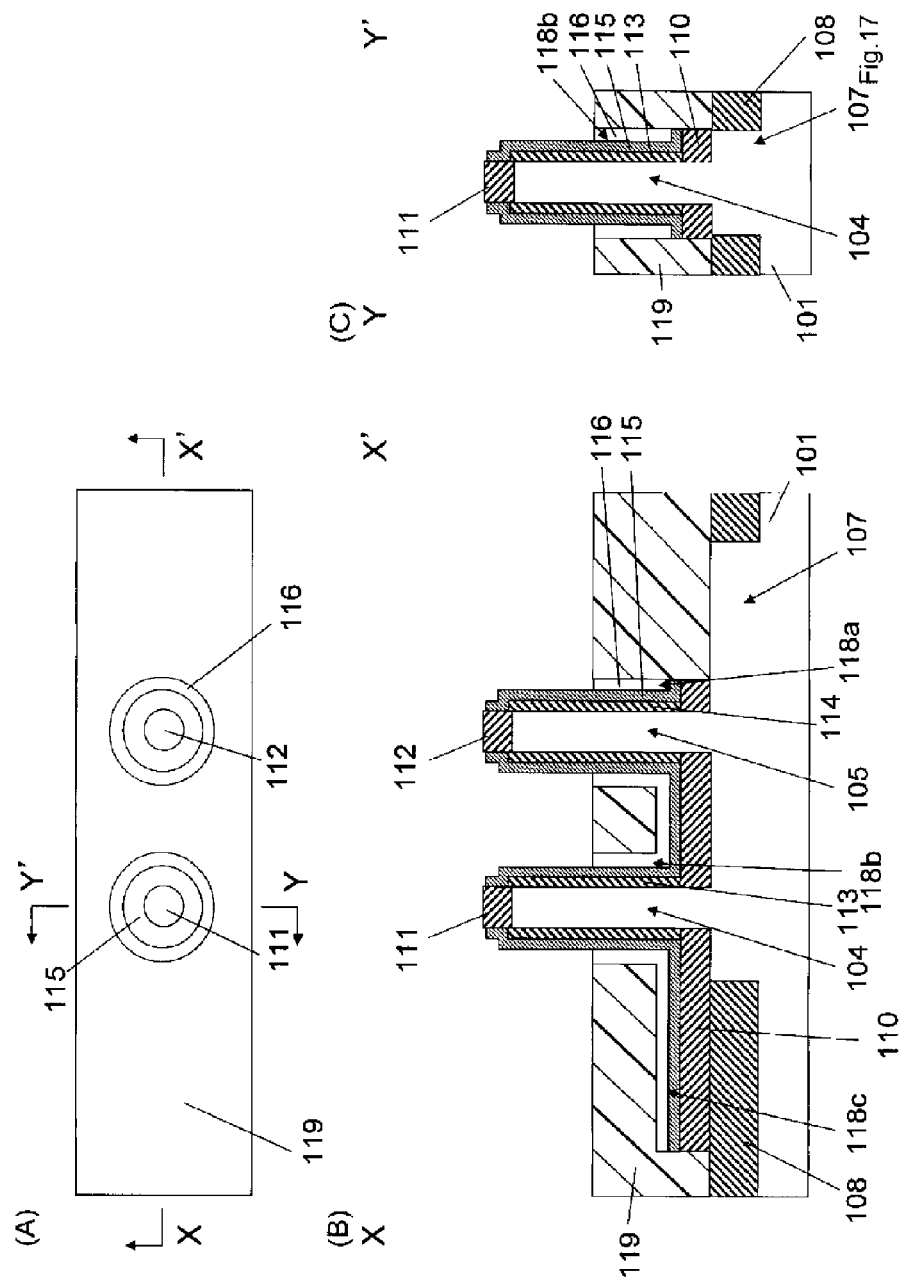
FIG. 17(A) is a plan view showing a method for producing a semiconductor device according to this embodiment.
FIG. 17(B) is a sectional view taken along line X-X' of FIG. 17(A).
FIG. 17(C) is a sectional view taken along line Y-Y' of FIG. 17(A).

As illustrated in FIG. 17, the exposed portions of the polysilicon film 116 are removed by etching, which is preferably performed by isotropic dry etching.

Figure 18:
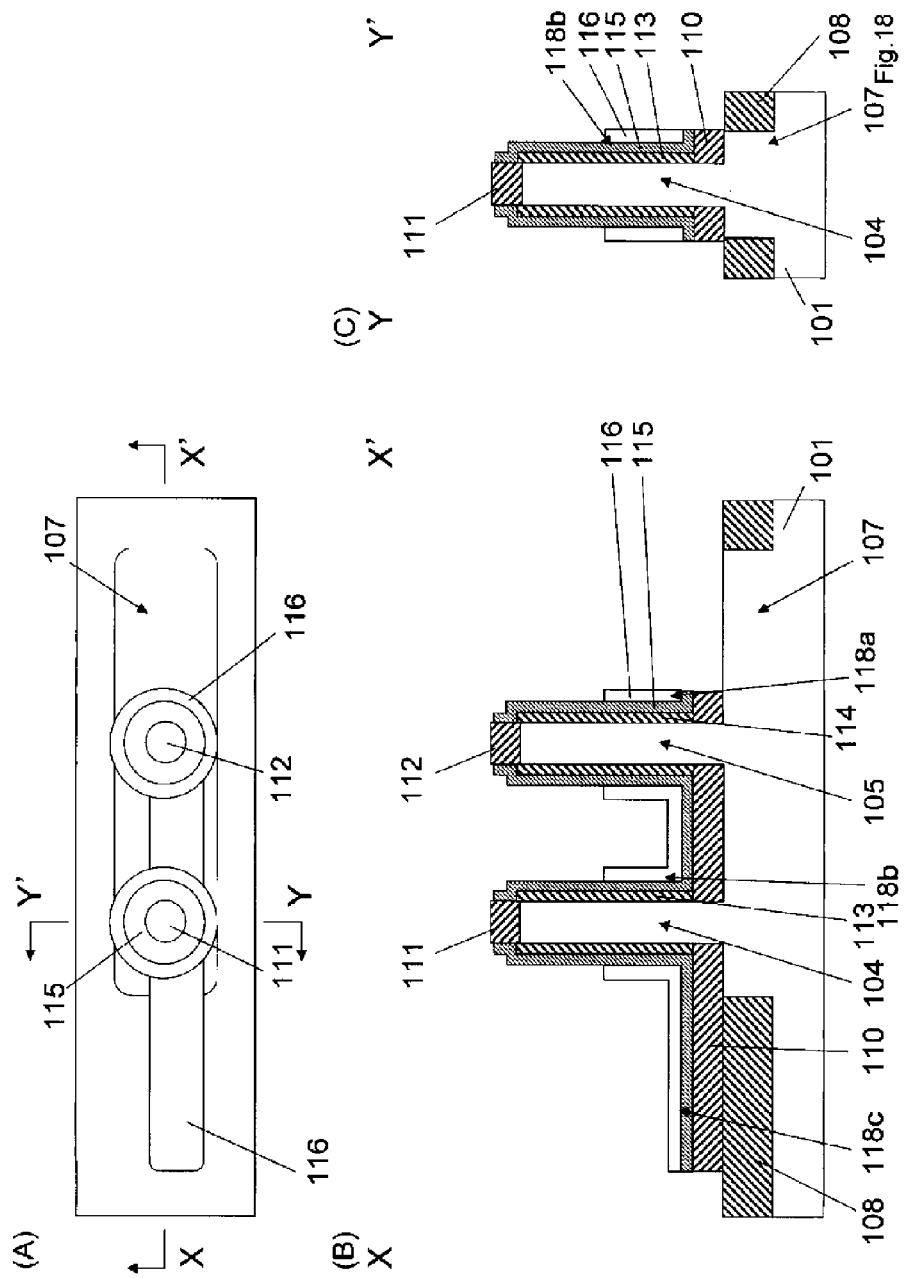
FIG. 18(A) is a plan view showing a method for producing a semiconductor device according to this embodiment.
FIG. 18(B) is a sectional view taken along line X-X' of FIG. 18(A).
FIG. 18(C) is a sectional view taken along line Y-Y' of FIG. 18(A).

As illustrated in FIG. 18, the fourth resist 119 is stripped.

Figure 19:
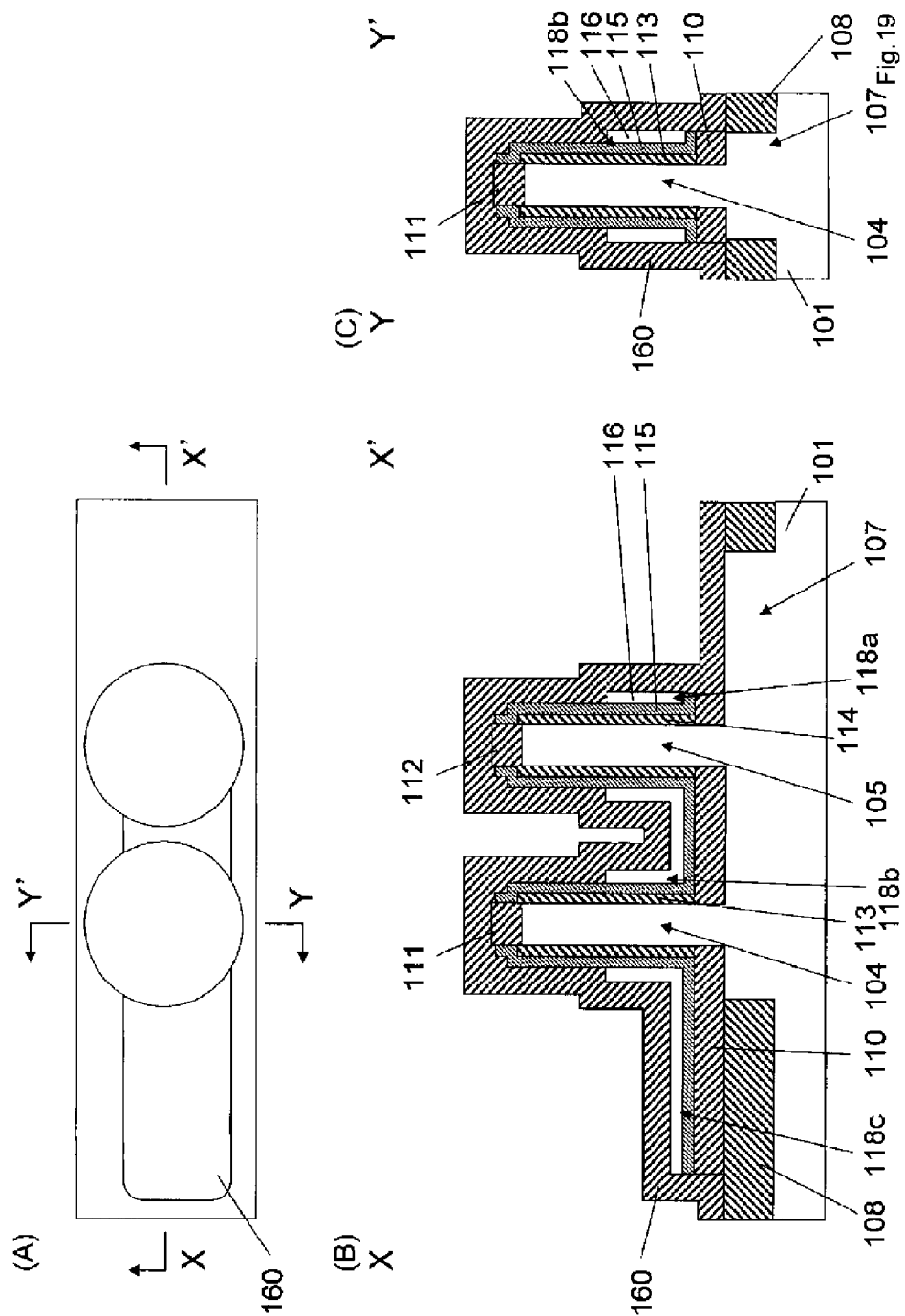
FIG. 19(A) is a plan view showing a method for producing a semiconductor device according to this embodiment.
FIG. 19(B) is a sectional view taken along line X-X' of FIG. 19(A).
FIG. 19(C) is a sectional view taken along line Y-Y' of FIG. 19(A).

As illustrated in FIG. 19, an oxide film 160 is deposited.

Figure 20:
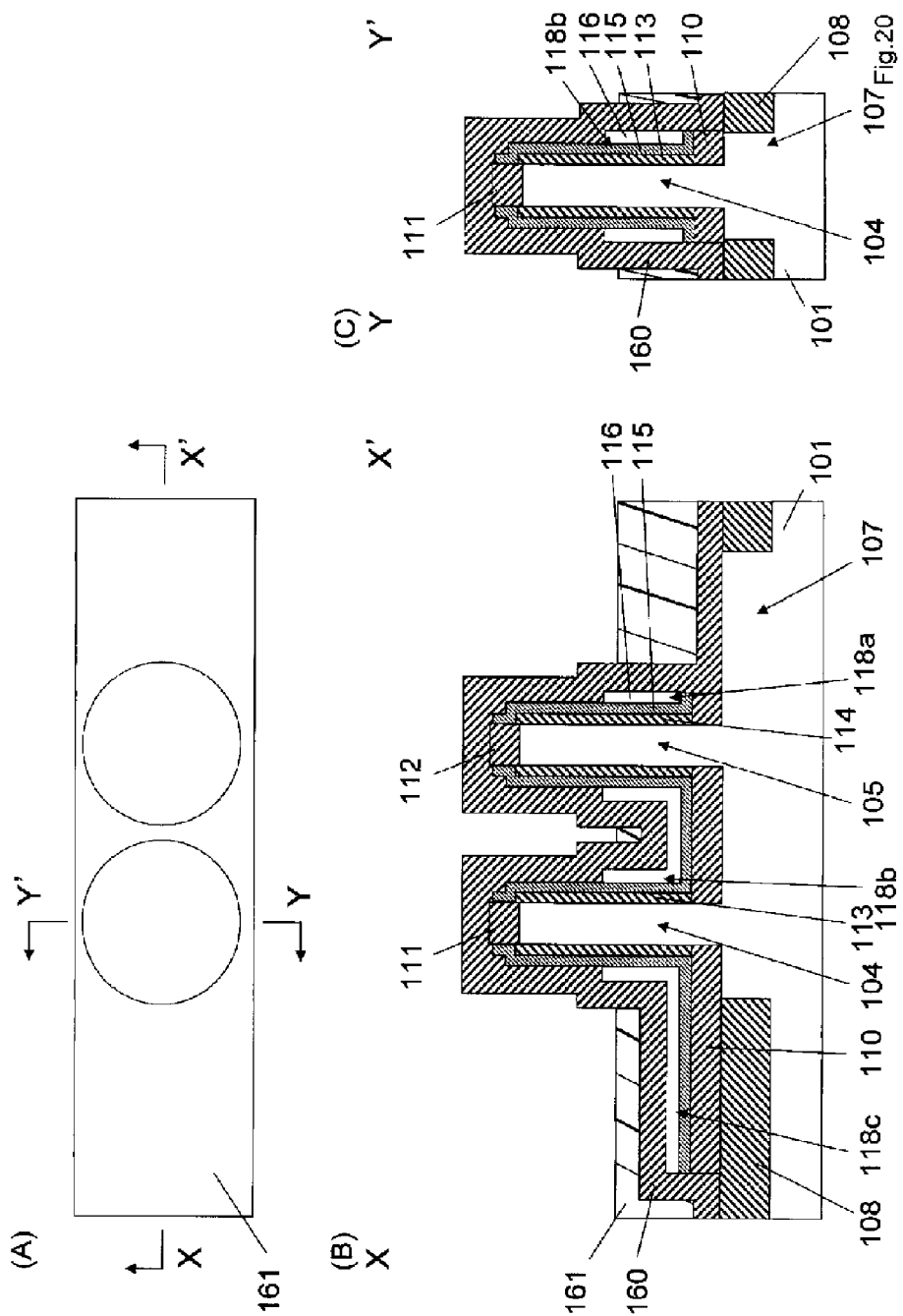
FIG. 20(A) is a plan view showing a method for producing a semiconductor device according to this embodiment.
FIG. 20(B) is a sectional view taken along line X-X' of FIG. 20(A).
FIG. 20(C) is a sectional view taken along line Y-Y' of FIG. 20(A).

As illustrated in FIG. 20, a fifth resist 161 is deposited; and portions of the oxide film 160 on upper side walls of the first pillar-shaped silicon layer 104 and the second pillar-shaped silicon layer 105 are exposed, which is preferably achieved by resist etch back. Alternatively, a spin-on-glass coating film may be used.

Figure 21:
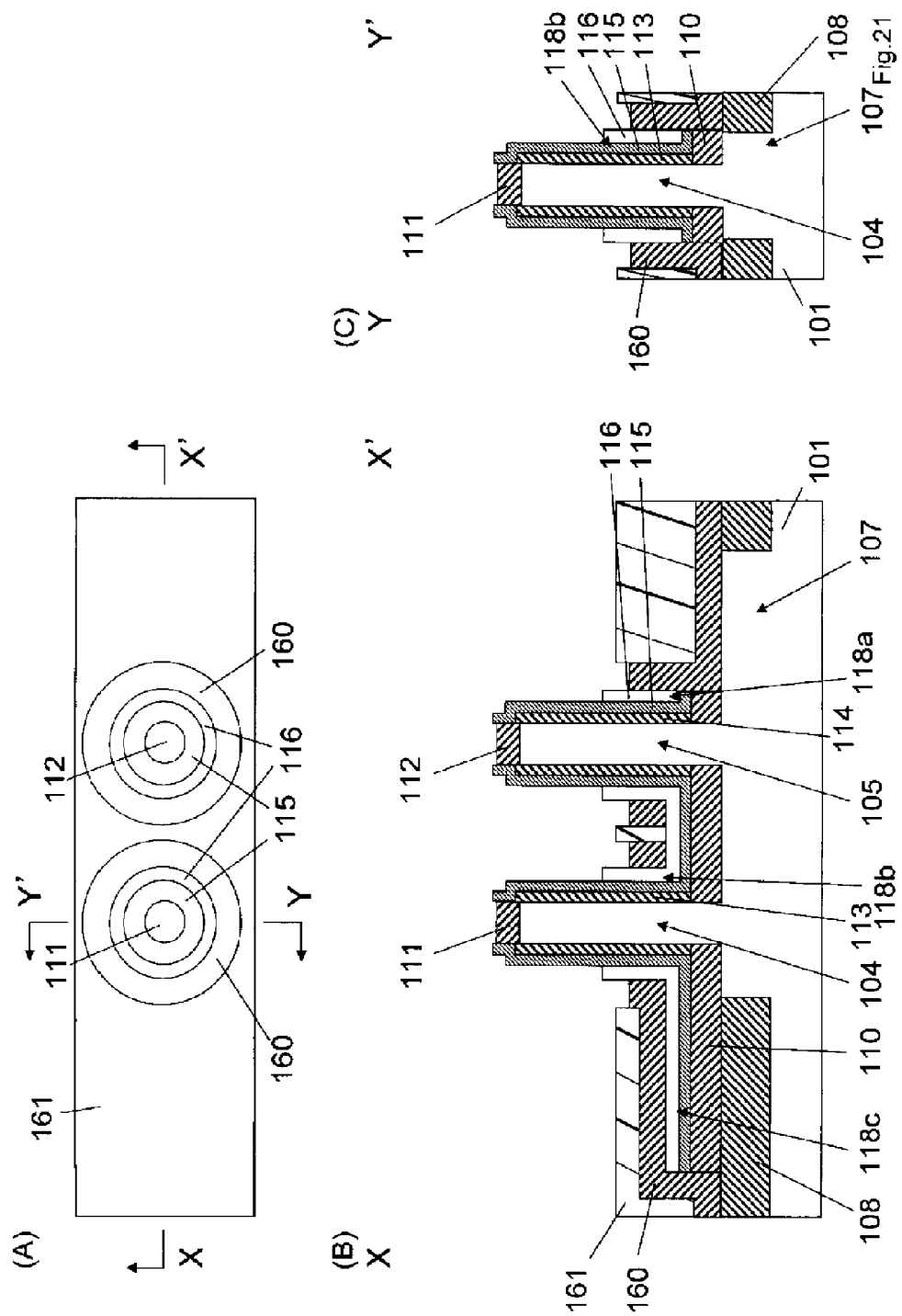
FIG. 21(A) is a plan view showing a method for producing a semiconductor device according to this embodiment.
FIG. 21(B) is a sectional view taken along line X-X' of FIG. 21(A).
FIG. 21(C) is a sectional view taken along line Y-Y' of FIG. 21(A).

As illustrated in FIG. 21, the exposed portions of the oxide film 160 are removed by etching, which is preferably performed by isotropic etching.

Figure 22:
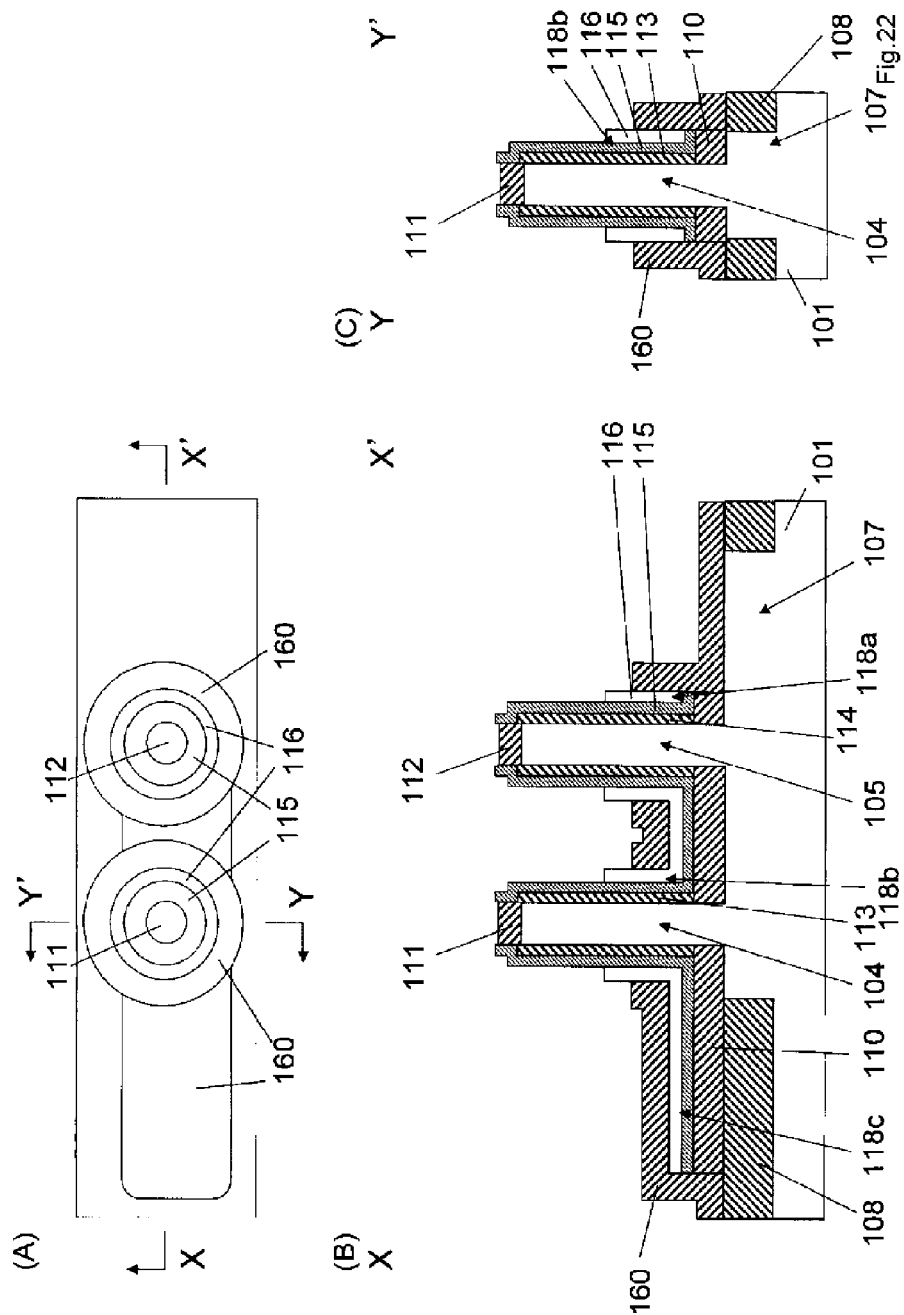
FIG. 22(A) is a plan view showing a method for producing a semiconductor device according to this embodiment.
FIG. 22(B) is a sectional view taken along line X-X' of FIG. 22(A).
FIG. 22(C) is a sectional view taken along line Y-Y' of FIG. 22(A).

As illustrated in FIG. 22, the fifth resist 161 is stripped.

Figure 23:
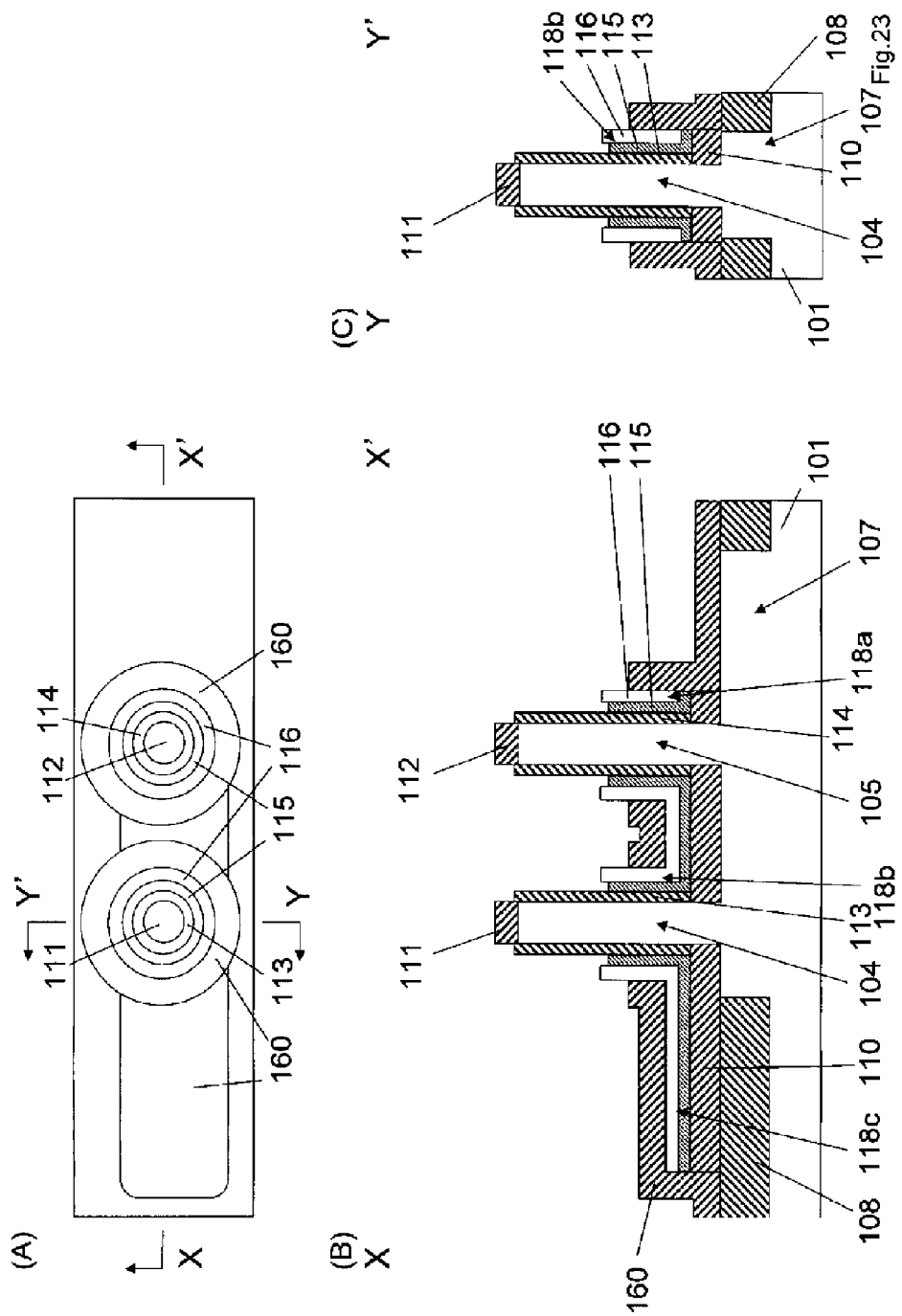
FIG. 23(A) is a plan view showing a method for producing a semiconductor device according to this embodiment.
FIG. 23(B) is a sectional view taken along line X-X' of FIG. 23(A).
FIG. 23(C) is a sectional view taken along line Y-Y' of FIG. 23(A).

As illustrated in FIG. 23, the metal film 115 is removed by etching to form the first gate electrode 118b and the second gate electrode 118a that are connected to the gate line 118c. Thus, a self-aligned process is performed.

Figure 24:
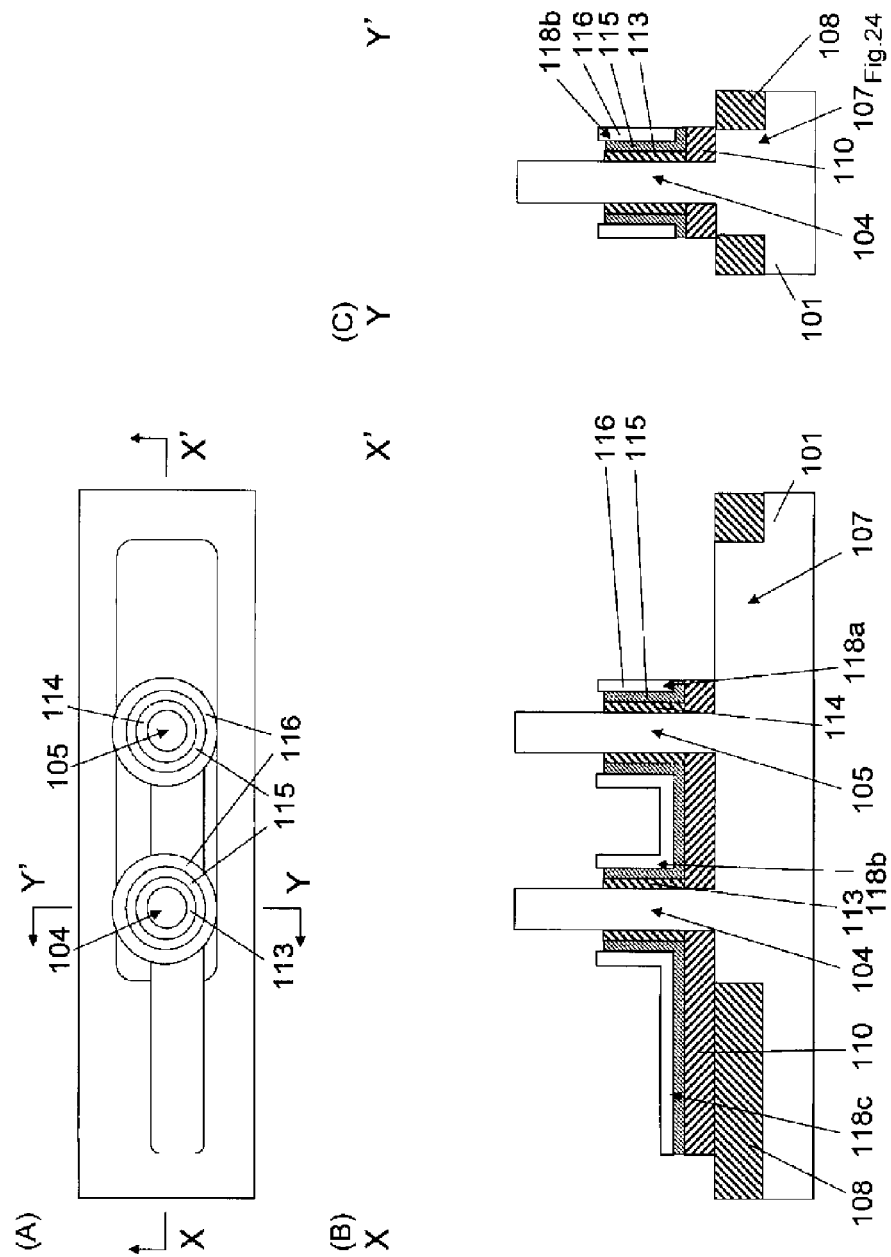
FIG. 24(A) is a plan view showing a method for producing a semiconductor device according to this embodiment.
FIG. 24(B) is a sectional view taken along line X-X' of FIG. 24(A).
FIG. 24(C) is a sectional view taken along line Y-Y' of FIG. 24(A).

As illustrated in FIG. 24, the oxide film hard masks 111 and 112 and the oxide film 160 are removed by etching.

Thus, the fourth step has been described that includes depositing a fourth resist, exposing a portion of the polysilicon film on an upper side wall of each of the first pillar-shaped silicon layer and the second pillar-shaped silicon layer, removing the exposed portion of the polysilicon film by etching, stripping the fourth resist, and removing the metal film by etching to form a first gate electrode and a second gate electrode that are connected to the gate line.

Hereafter, a fifth step will be described that includes forming a first n-type diffusion layer in an upper portion of the first pillar-shaped silicon layer, forming a second n-type diffusion layer in a lower portion of the first pillar-shaped silicon layer and in an upper portion of the planar silicon layer, forming a first p-type diffusion layer in an upper portion of the second pillar-shaped silicon layer, and forming a second p-type diffusion layer in a lower portion of the second pillar-shaped silicon layer and in an upper portion of the planar silicon layer.

Figure 25:
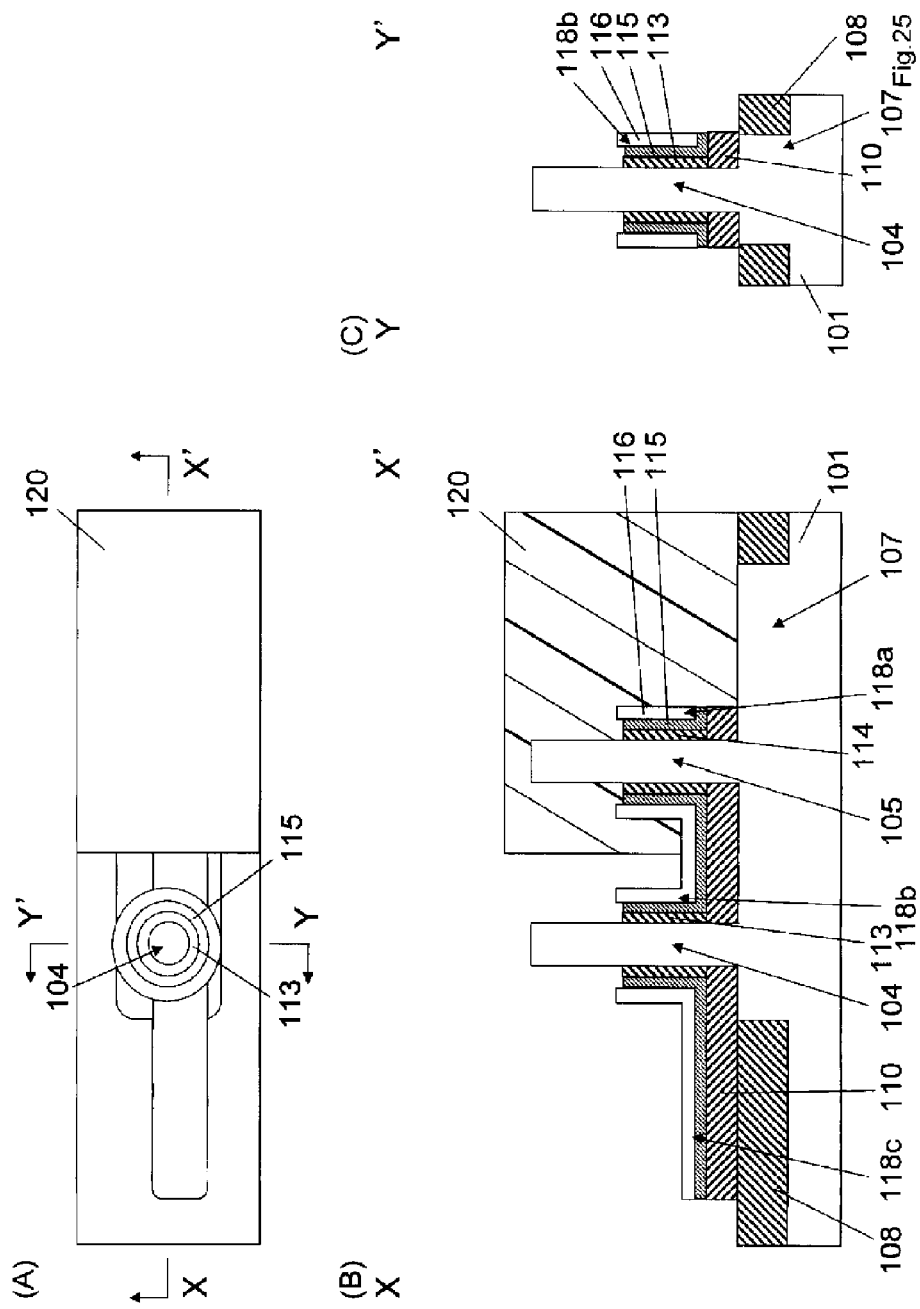
FIG. 25(A) is a plan view showing a method for producing a semiconductor device according to this embodiment.
FIG. 25(B) is a sectional view taken along line X-X' of FIG. 25(A).
FIG. 25(C) is a sectional view taken along line Y-Y' of FIG. 25(A).

As illustrated in FIG. 25, a sixth resist 120 is formed for the purpose of forming a first n-type diffusion layer and a second n-type diffusion layer. Before the sixth resist 120 is formed, a thin oxide film may be deposited.

Figure 26:
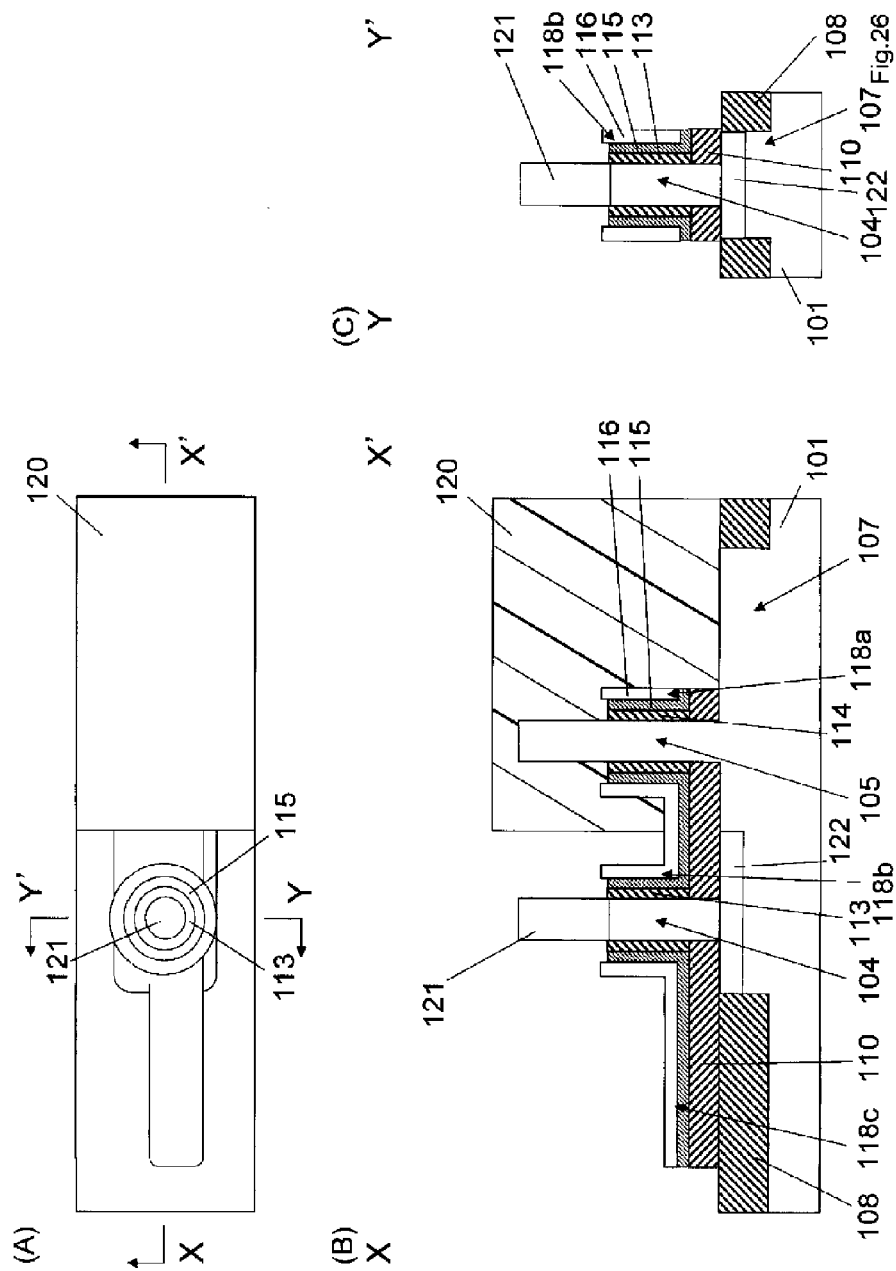
FIG. 26(A) is a plan view showing a method for producing a semiconductor device according to this embodiment.
FIG. 26(B) is a sectional view taken along line X-X' of FIG. 26(A).
FIG. 26(C) is a sectional view taken along line Y-Y' of FIG. 26(A).

As illustrated in FIG. 26, arsenic is implanted to form a first n-type diffusion layer 121 and a second n-type diffusion layer 122.

Figure 27:
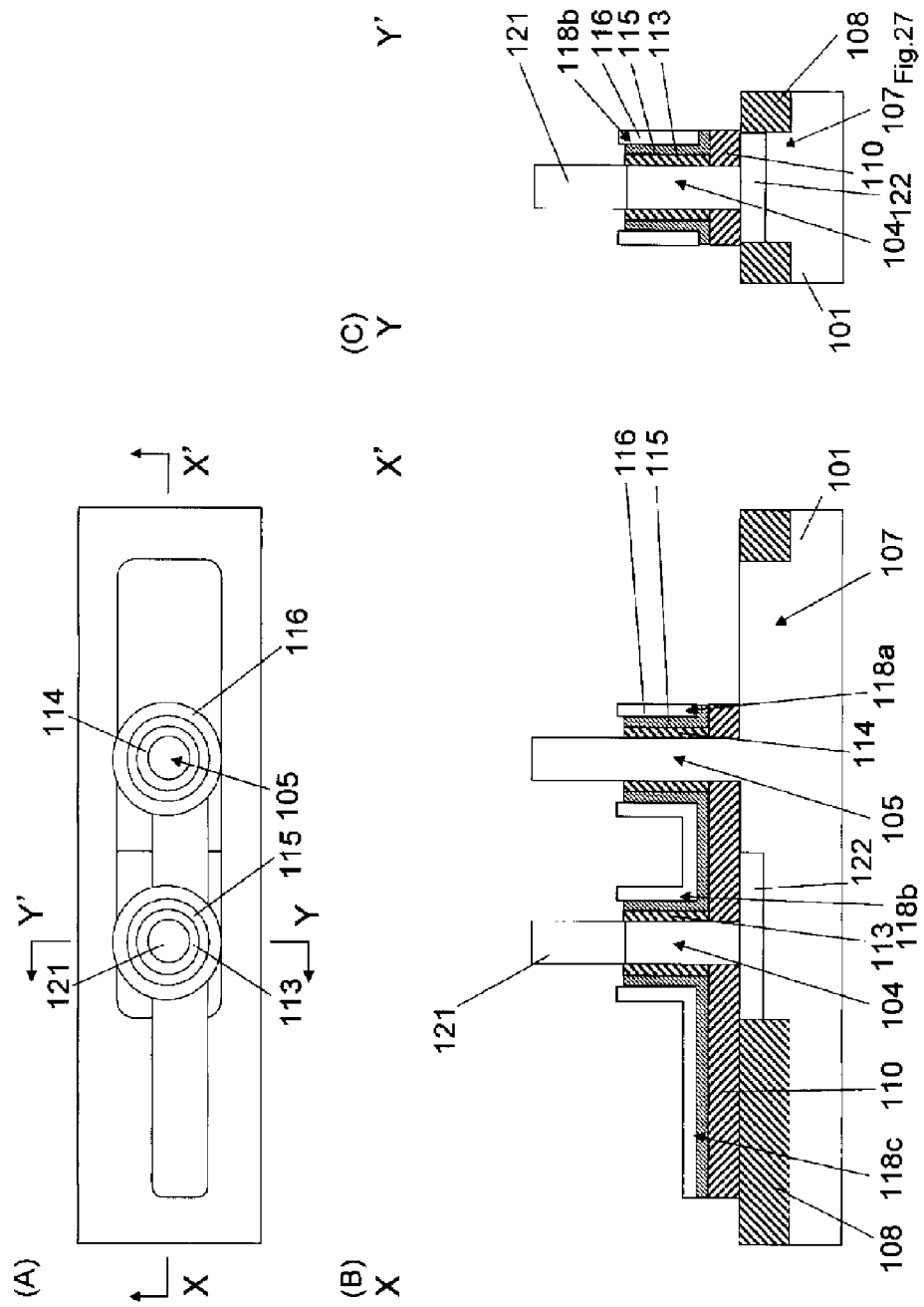
FIG. 27(A) is a plan view showing a method for producing a semiconductor device according to this embodiment.
FIG. 27(B) is a sectional view taken along line X-X' of FIG. 27(A).
FIG. 27(C) is a sectional view taken along line Y-Y' of FIG. 27(A).

As illustrated in FIG. 27, the sixth resist 120 is stripped.

Figure 28:
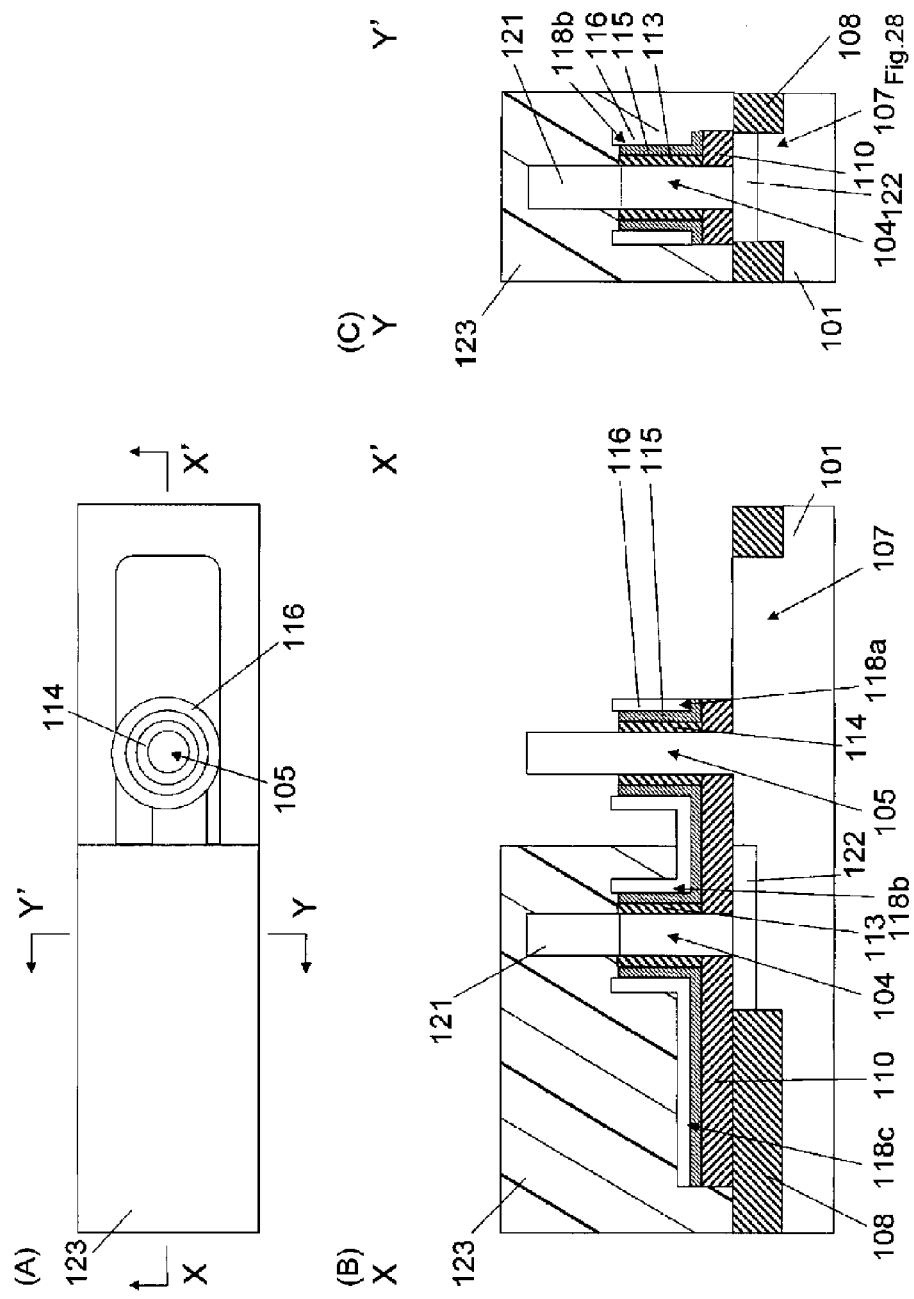
FIG. 28(A) is a plan view showing a method for producing a semiconductor device according to this embodiment.
FIG. 28(B) is a sectional view taken along line X-X' of FIG. 28(A).
FIG. 28(C) is a sectional view taken along line Y-Y' of FIG. 28(A).

As illustrated in FIG. 28, a seventh resist 123 is formed for forming a first p-type diffusion layer and a second p-type diffusion layer.

Figure 29:
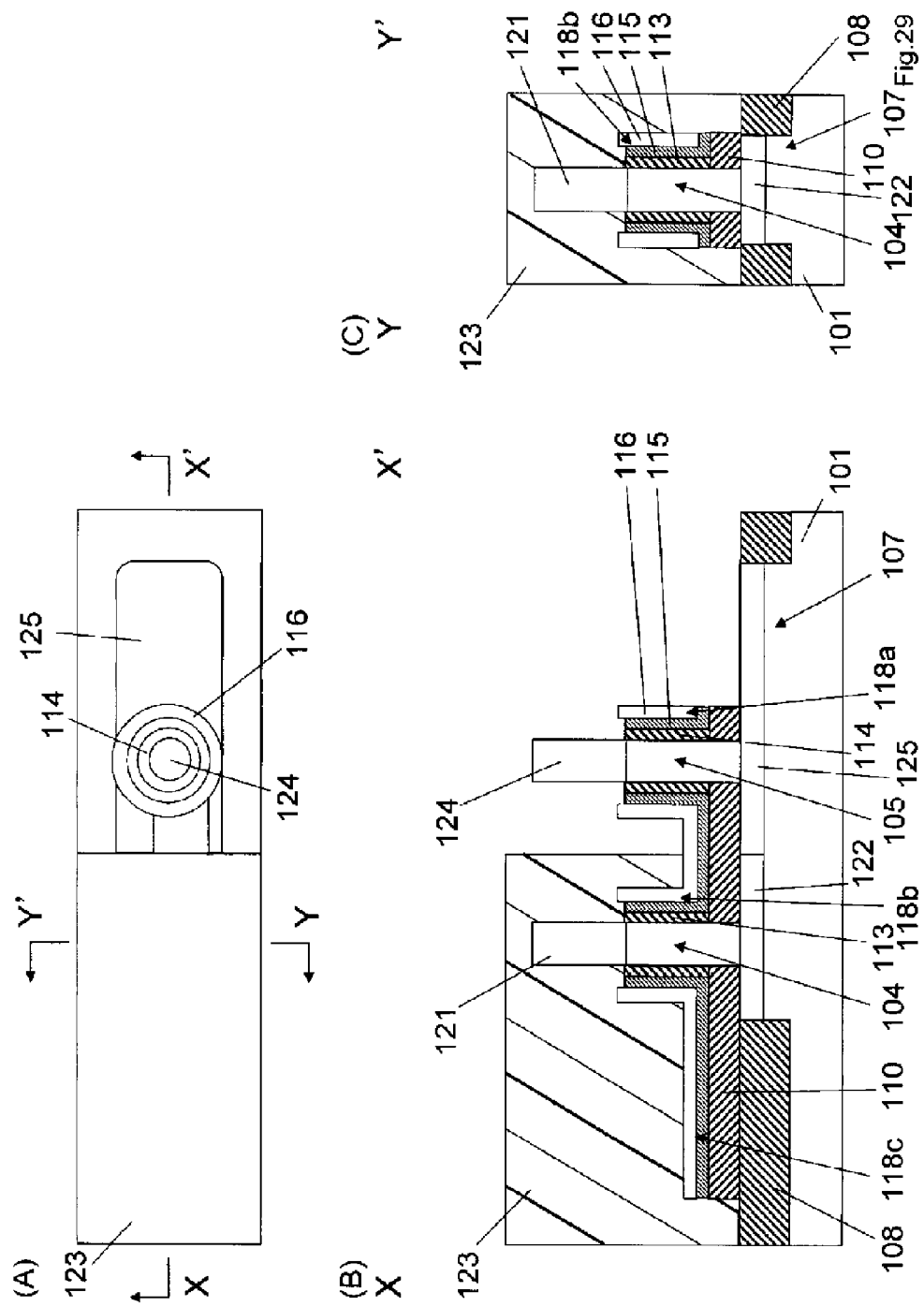
FIG. 29(A) is a plan view showing a method for producing a semiconductor device according to this embodiment.
FIG. 29(B) is a sectional view taken along line X-X' of FIG. 29(A).
FIG. 29(C) is a sectional view taken along line Y-Y' of FIG. 29(A).

As illustrated in FIG. 29, boron or boron fluoride is implanted to form a first p-type diffusion layer 124 and a second p-type diffusion layer 125.

Figure 30:
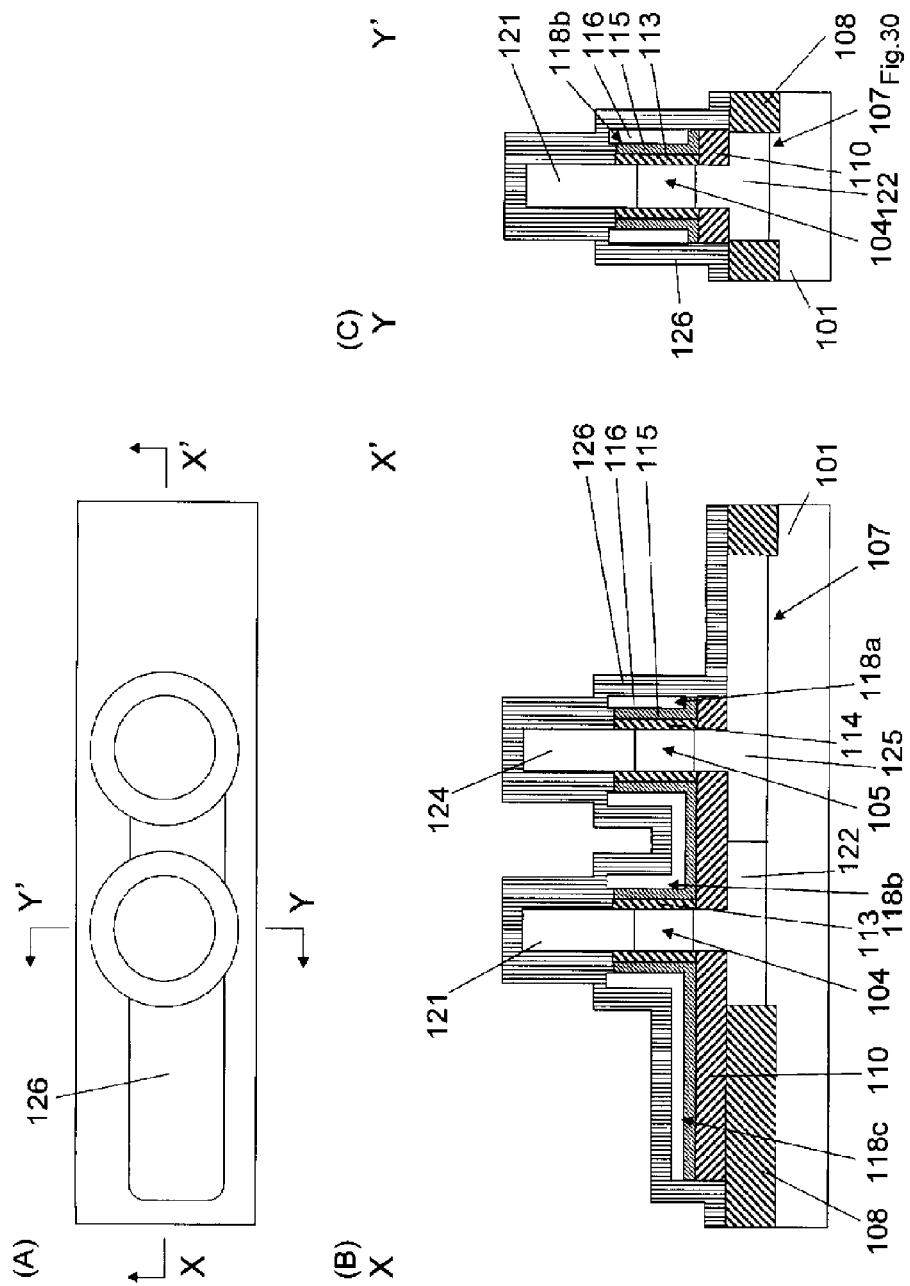
FIG. 30(A) is a plan view showing a method for producing a semiconductor device according to this embodiment.
FIG. 30(B) is a sectional view taken along line X-X' of FIG. 30(A).
FIG. 30(C) is a sectional view taken along line Y-Y' of FIG. 30(A).

As illustrated in FIG. 30, the seventh resist 123 is stripped, a nitride film 126 is deposited, and a heat treatment is performed.

Thus, the fifth step has been described that includes forming a first n-type diffusion layer in an upper portion of the first pillar-shaped silicon layer, forming a second n-type diffusion layer in a lower portion of the first pillar-shaped silicon layer and in an upper portion of the planar silicon layer, forming a first p-type diffusion layer in an upper portion of the second pillar-shaped silicon layer, and forming a second p-type diffusion layer in a lower portion of the second pillar-shaped silicon layer and in an upper portion of the planar silicon layer.

Hereafter, a sixth step will be described that includes forming silicides on the first n-type diffusion layer, the second n-type diffusion layer, the first p-type diffusion layer, the second p-type diffusion layer, and the gate line.

Figure 31:
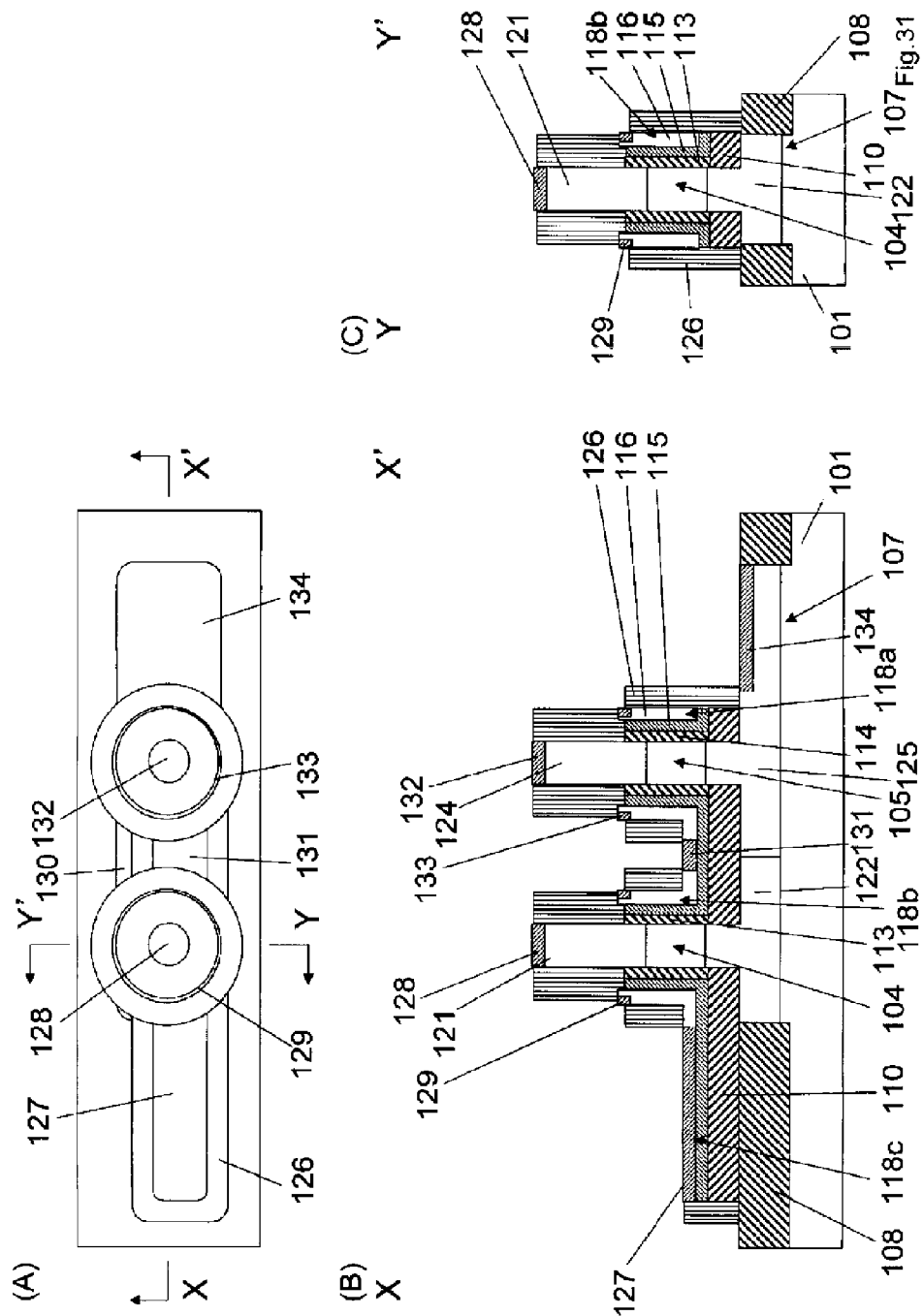
FIG. 31(A) is a plan view showing a method for producing a semiconductor device according to this embodiment.
FIG. 31(B) is a sectional view taken along line X-X' of FIG. 31(A).
FIG. 31(C) is a sectional view taken along line Y-Y' of FIG. 31(A).

As illustrated in FIG. 31, the nitride film 126 is etched to form nitride film side walls; and a metal is deposited, a heat treatment is performed, and unreacted metal is removed. As a result, silicides 128, 130, 132, 134, 127, 131, 129, and 133 are formed on the first n-type diffusion layer 121, the second n-type diffusion layer 122, the first p-type diffusion layer 124, the second p-type diffusion layer 125, the gate line 118c, the first gate electrode 118b and the second gate electrode 118a. The nitride film side walls may have a laminated structure of an oxide film and a nitride film.

The connection between the second n-type diffusion layer 122 and the second p-type diffusion layer 125 is achieved by the silicide 130. Since the center line of the gate line 118c is displaced from a line that connects the center point of the first pillar-shaped silicon layer 104 to the center point of the second pillar-shaped silicon layer 105, the silicide 130 is easily formed, which allows high degree of integration.

In addition, since the polysilicon film 116 is thin, the gate line 118c tends to have a laminated structure of the metal film 115 and the silicide 127. The direct contact between the silicide 127 and the metal film 115 allows a decrease in the resistance.

Thus, the sixth step has been described that includes forming silicides on the first n-type diffusion layer, the second n-type diffusion layer, the first p-type diffusion layer, the second p-type diffusion layer, and the gate line.

Figure 32:
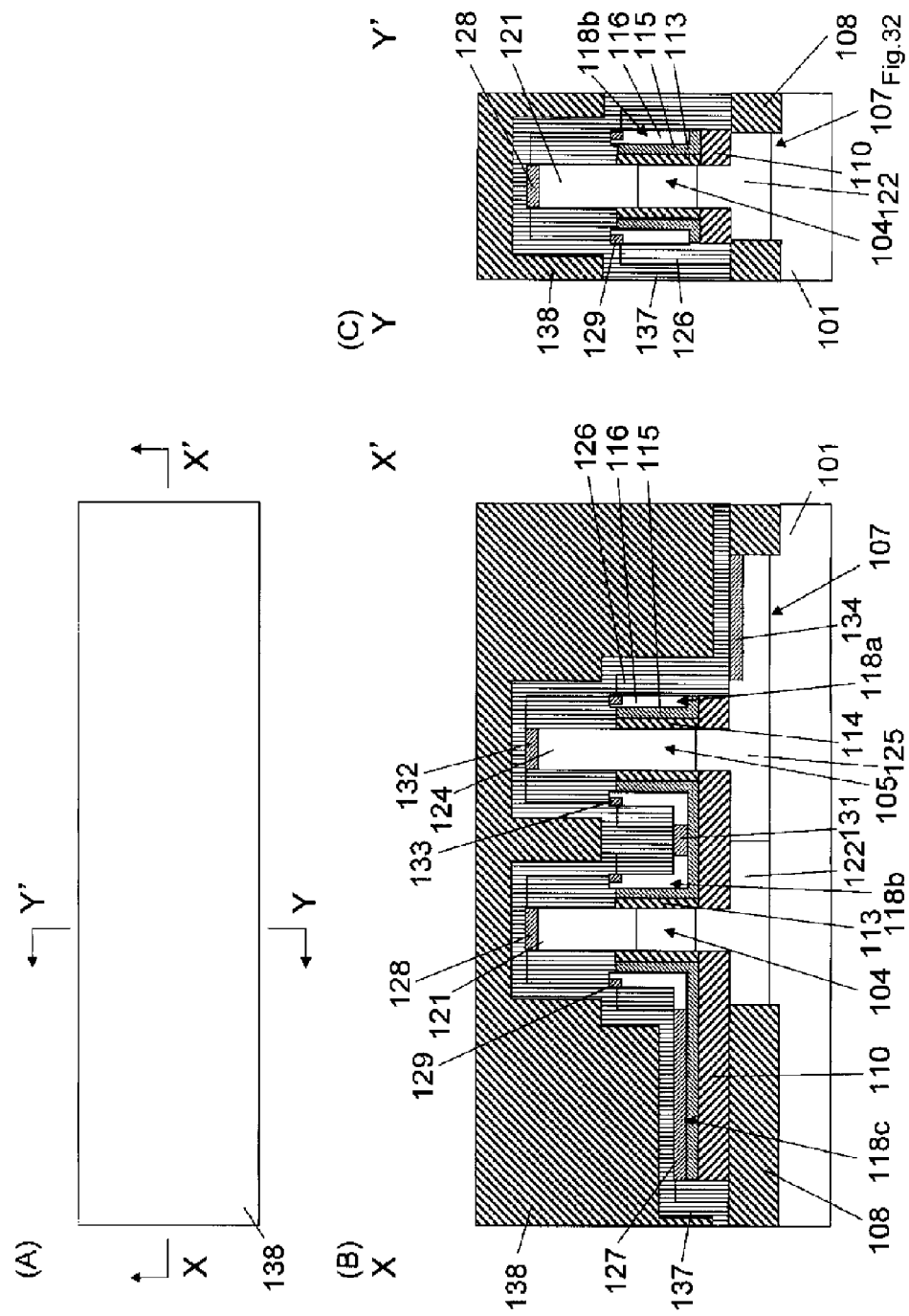
FIG. 32(A) is a plan view showing a method for producing a semiconductor device according to this embodiment.
FIG. 32(B) is a sectional view taken along line X-X' of FIG. 32(A).
FIG. 32(C) is a sectional view taken along line Y-Y' of FIG. 32(A).

As illustrated in FIG. 32, a contact stopper 137 such as a nitride film is formed; and an interlayer insulating film 138 is formed.

Figure 33:
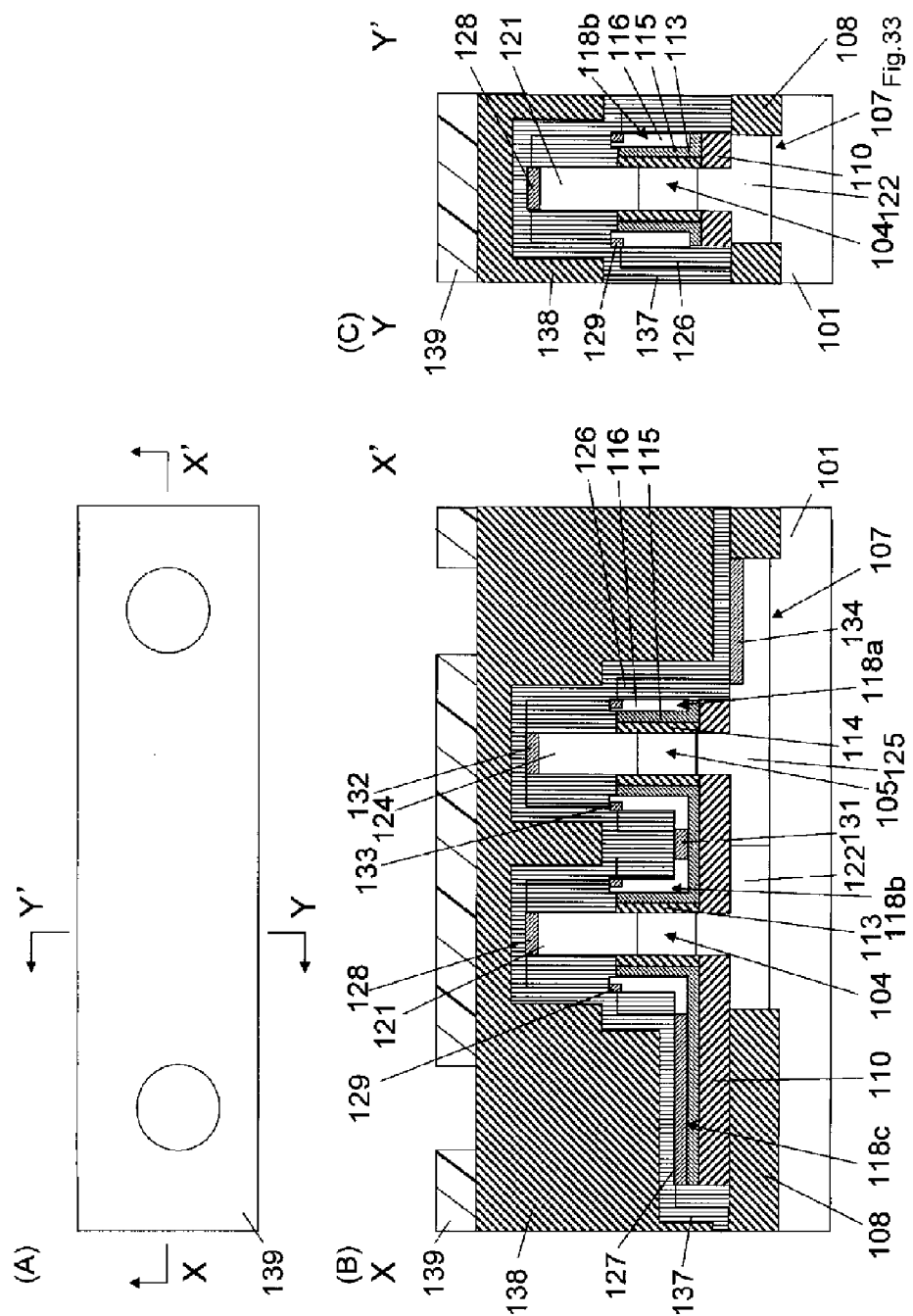
FIG. 33(A) is a plan view showing a method for producing a semiconductor device according to this embodiment.
FIG. 33(B) is a sectional view taken along line X-X' of FIG. 33(A).
FIG. 33(C) is a sectional view taken along line Y-Y' of FIG. 33(A).

As illustrated in FIG. 33, an eighth resist 139 for forming contact holes is formed.

Figure 34:
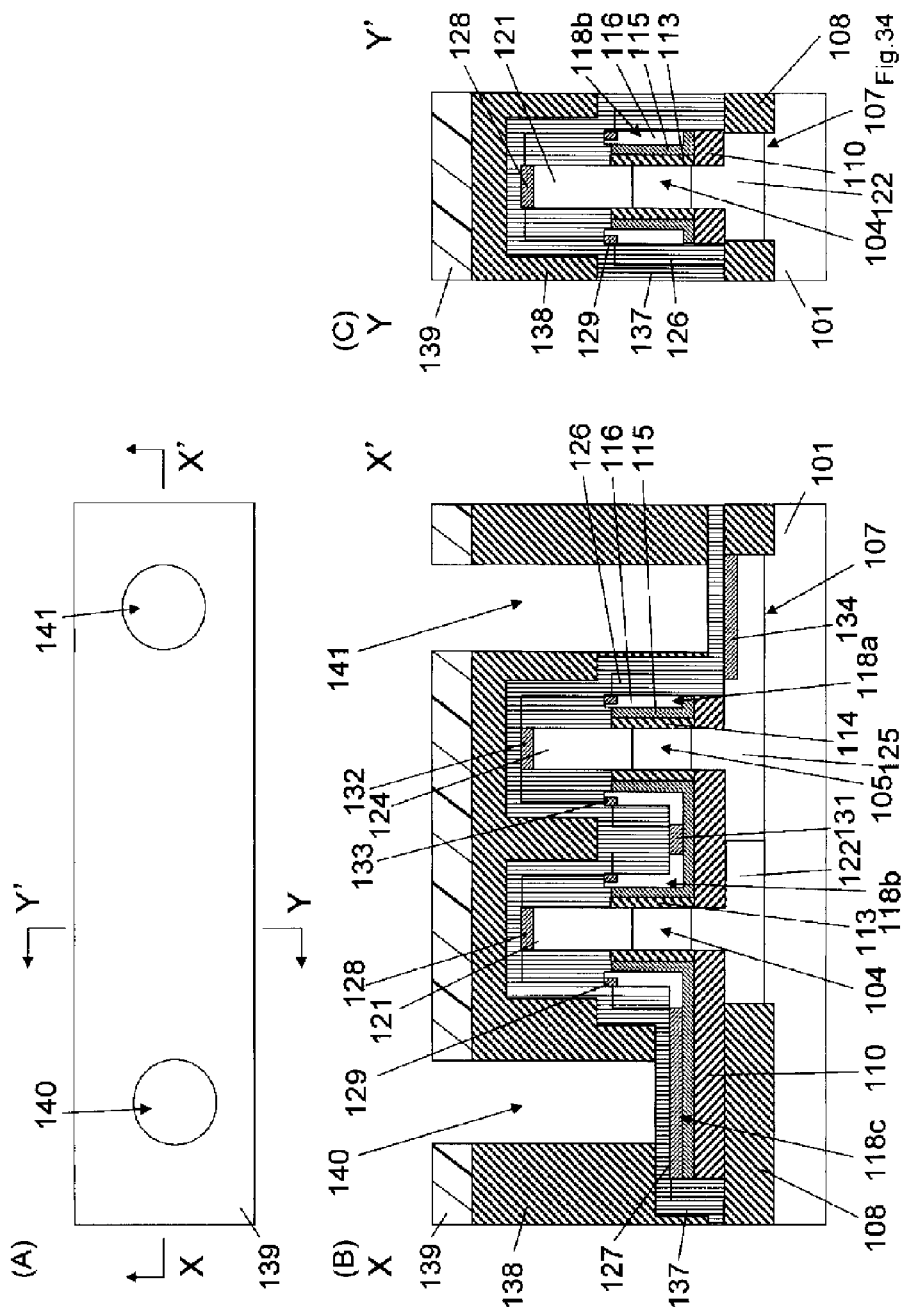
FIG. 34(A) is a plan view showing a method for producing a semiconductor device according to this embodiment.
FIG. 34(B) is a sectional view taken along line X-X' of FIG. 34(A).
FIG. 34(C) is a sectional view taken along line Y-Y' of FIG. 34(A).

As illustrated in FIG. 34, the interlayer insulating film 138 is etched to form contact holes 140 and 141.

Figure 35:
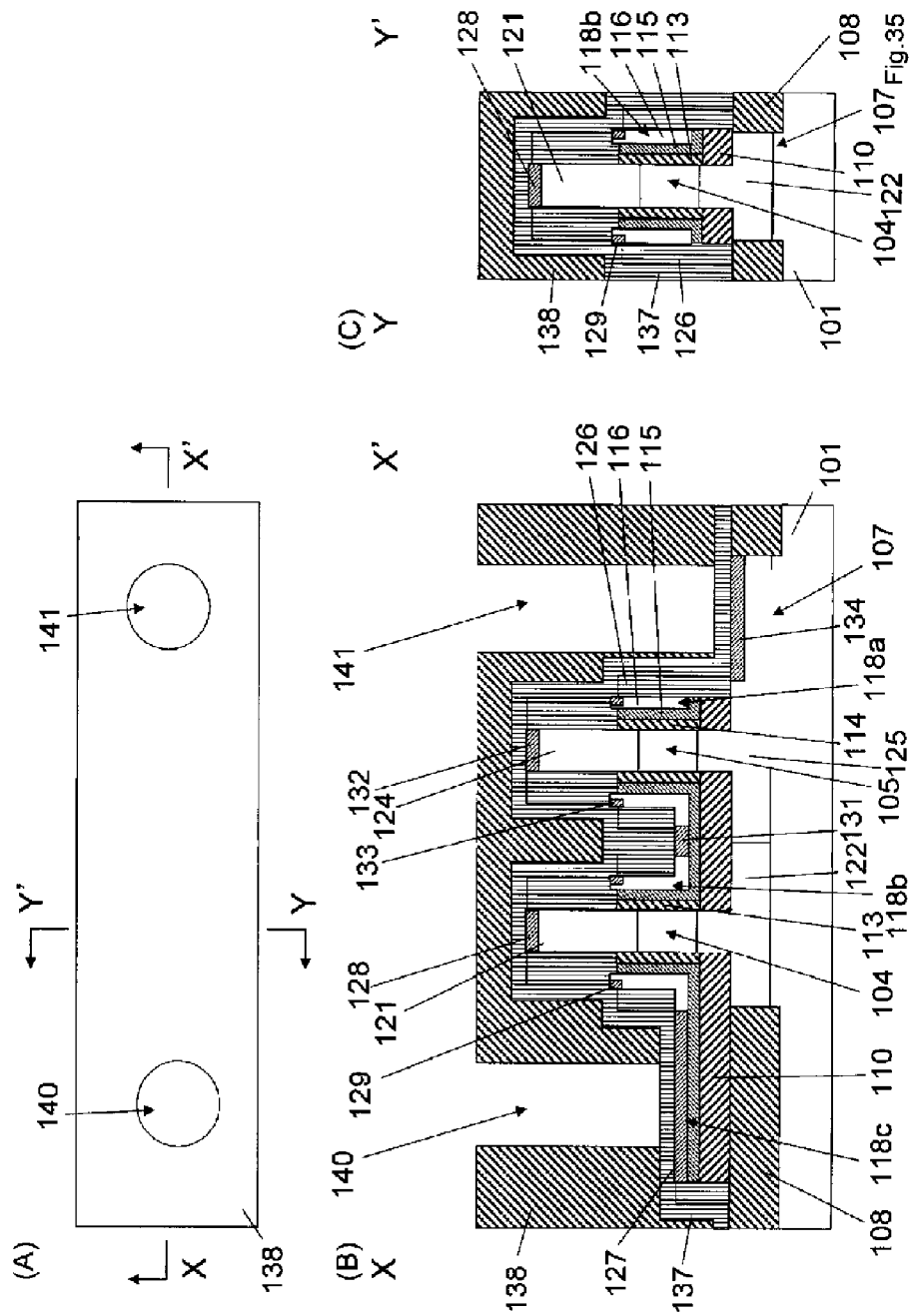
FIG. 35(A) is a plan view showing a method for producing a semiconductor device according to this embodiment.
FIG. 35(B) is a sectional view taken along line X-X' of FIG. 35(A).
FIG. 35(C) is a sectional view taken along line Y-Y' of FIG. 35(A).

As illustrated in FIG. 35, the eighth resist 139 is stripped.

Figure 36:
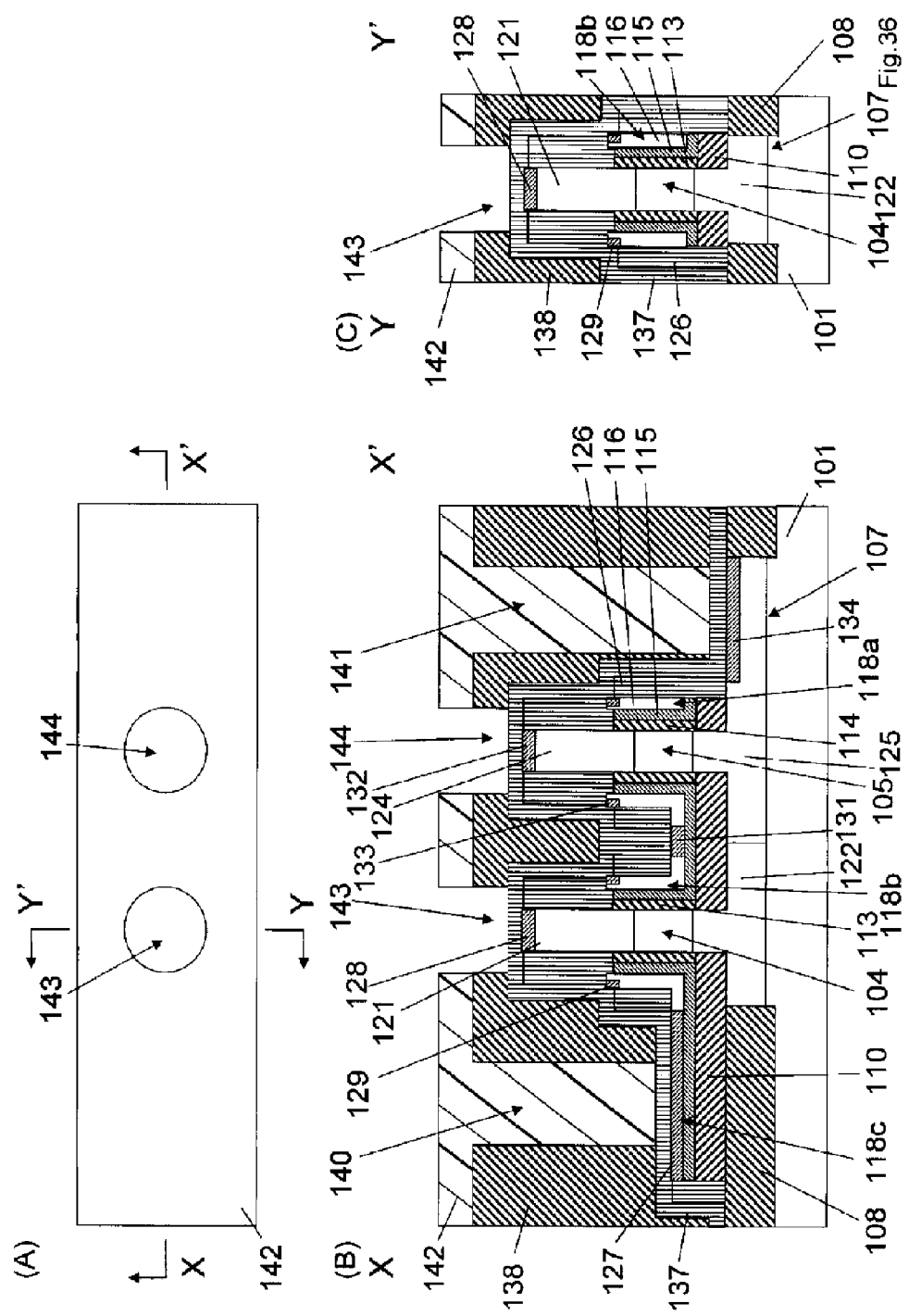
FIG. 36(A) is a plan view showing a method for producing a semiconductor device according to this embodiment.
FIG. 36(B) is a sectional view taken along line X-X' of FIG. 36(A).
FIG. 36(C) is a sectional view taken along line Y-Y' of FIG. 36(A).

As illustrated in FIG. 36, a ninth resist 142 for forming contact holes is formed. The interlayer insulating film 138 is etched to form contact holes 143 and 144.

As illustrated in FIG. 37, the ninth resist 142 is stripped.

As illustrated in FIG. 38, the contact stopper 137 is etched to remove portions of the contact stopper 137 below the contact holes 140 and 141 and the contact holes 143 and 144.

As illustrated in FIG. 39, a metal is deposited to form contacts 145, 146, 147, and 148.

As illustrated in FIG. 40, a metal 149 for metal wirings is deposited.

As illustrated in FIG. 41, tenth resists 150, 151, 152, and 153 for forming metal wirings are formed.

As illustrated in FIG. 42, the metal 149 is etched to form metal wirings 154, 155, 156, and 157.

Next, as illustrated in FIG. 43, the tenth resists 150, 151, 152, and 153 are stripped. Thus, a method for producing an SGT in which a thin gate material is used, a metal gate is employed, and a self-aligned process is performed has been described.

Figure 1:
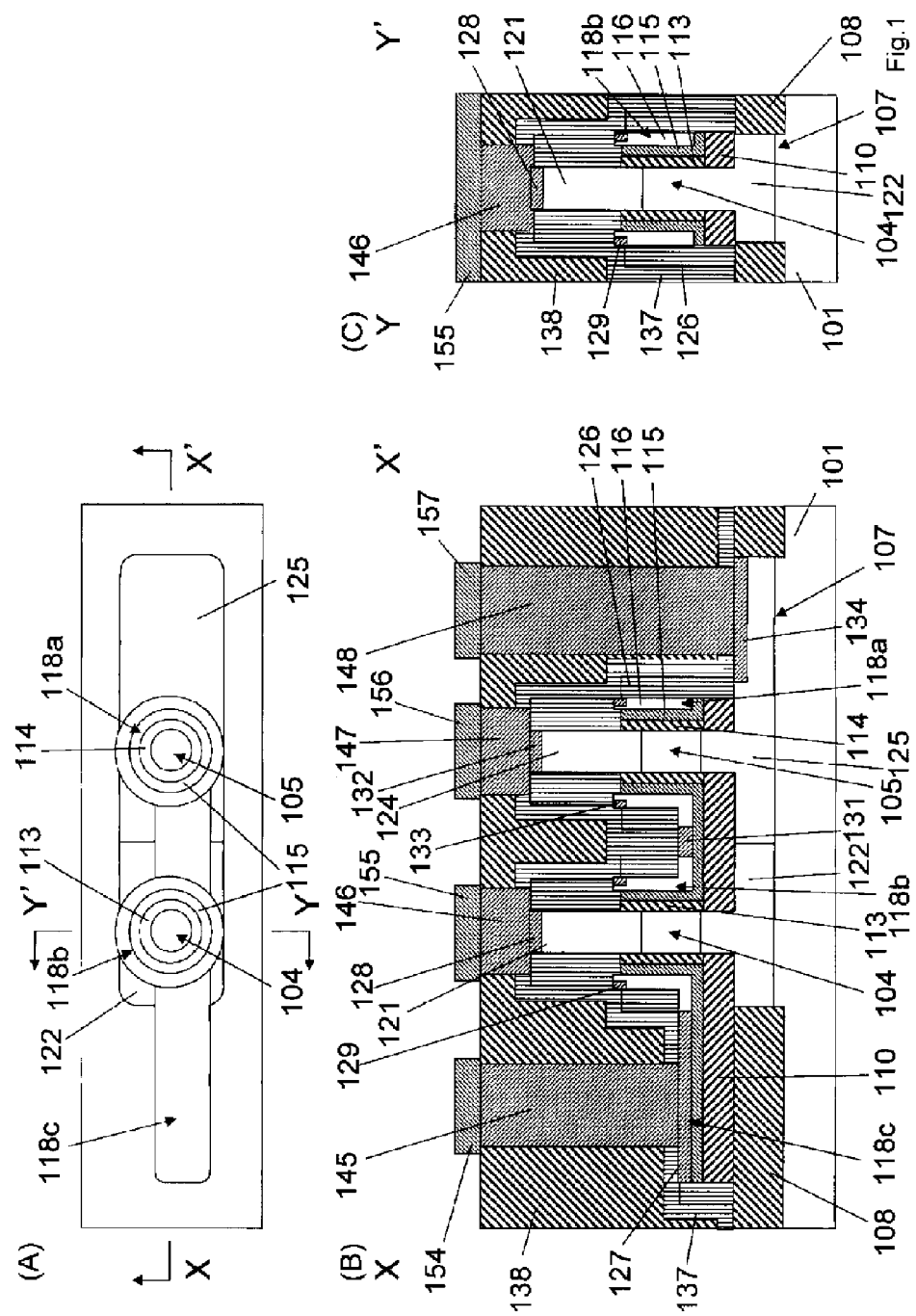
FIG. 1(A) is a plan view of a semiconductor device according to an embodiment of the present invention.
FIG. 1(B) is a sectional view taken along line X-X' of FIG. 1(A).
FIG. 1(C) is a sectional view taken along line Y-Y' of FIG. 1(A).

The structure of a semiconductor device obtained by the above-described production method is illustrated in FIG. 1. As illustrated in FIG. 1, the semiconductor device includes the planar silicon layer 107 formed on the silicon substrate 101; the first and second pillar-shaped silicon layers 104 and 105 formed on the planar silicon layer 107; the gate insulating film 113 formed around the first pillar-shaped silicon layer 104; the first gate electrode 118b having a laminated structure of the metal film 115 and the polysilicon film 116 and formed around the gate insulating film 113; the gate insulating film 114 formed around the second pillar-shaped silicon layer 105; the second gate electrode 118a having a laminated structure of the metal film 115 and the polysilicon film 116 and formed around the gate insulating film 114, the polysilicon film 116 having a thickness that is smaller than half of a distance between the first pillar-shaped silicon layer 104 and the second pillar-shaped silicon layer 105; the gate line 118c connected to the first and second gate electrodes 118b and 118a, the gate line 118c having an upper surface located lower than upper surfaces of the first and second gate electrodes 118b and 118a; the second oxide film 110 formed between the gate line 118c and the planar silicon layer 107, the second oxide film 110 being thicker than the gate insulating films 113 and 114; the first n-type diffusion layer 121 formed in an upper portion of the first pillar-shaped silicon layer 104; the second n-type diffusion layer 112 formed in a lower portion of the first pillar-shaped silicon layer 104 and in an upper portion of the planar silicon layer 107; the first p-type diffusion layer 124 formed in an upper portion of the second pillar-shaped silicon layer 105; and the second p-type diffusion layer 125 formed in a lower portion of the second pillar-shaped silicon layer 105 and in an upper portion of the planar silicon layer 107.

The second oxide film 110 is formed between the gate line 118c and the planar silicon layer 107, the second oxide film 110 being thicker than the gate insulating films 113 and 114. Accordingly, capacitance between the gate line and the substrate can be decreased and insulation between the gate line and the substrate can be ensured.

In addition, the gate line 118c has a laminated structure of the metal film 115 and the silicide 127. The direct contact between the silicide 127 and the metal film 115 allows a decrease in the resistance.

The center line of the gate line 118c is displaced from a line that connects the center point of the first pillar-shaped silicon layer 104 to the center point of the second pillar-shaped silicon layer 105 by a first predetermined distance. The silicide 130 that connects the second n-type diffusion layer 122 to the second p-type diffusion layer 125 is easily formed, which allows high degree of integration.

In the present invention, various embodiments and modifications can be made without departing from the broad sprit and scope of the present invention. Furthermore, the above-described embodiment is provided to describe one embodiment of the present invention, and the scope of the present invention is not limited thereto.

For example, a method for producing a semiconductor device in which the p-type (including the p+-type) and the n-type (including the n+-type) are each changed to the opposite conductivity type in the above embodiment, and a semiconductor device produced by the method are also obviously included in the technical scope of the present invention.

The invention claimed is:

1. A method of producing a semiconductor device having a structure in which a source, a gate, and a drain are disposed so as to have a pillar shape perpendicular to a silicon substrate and a gate electrode surrounds a pillar-shaped semiconductor layer, the method comprising:
    a first step including forming a planar silicon layer on the silicon substrate and forming a first pillar-shaped silicon layer and a second pillar-shaped silicon layer on the planar silicon layer;
    a second step, following the first step, including forming an oxide film hard mask on the first pillar-shaped silicon layer and the second pillar-shaped silicon layer, and forming a second oxide film on the planar silicon layer, the second oxide film being thicker than a gate insulating film; and
    a third step following the second step, including forming the gate insulating film around each of the first pillar-shaped silicon layer and the second pillar-shaped silicon layer, forming a metal film and a polysilicon film around the gate insulating film, forming a third resist for forming a gate line, and performing anisotropic etching to form the gate line, the polysilicon film having a thickness that is smaller than half a distance between the first pillar-shaped silicon layer and the second pillar-shaped silicon layer.

2. The method for producing a semiconductor device according to claim 1, comprising:
    after the third step,
    a fourth step including depositing a fourth resist, exposing a portion of the polysilicon film on an upper side wall of each of the first pillar-shaped silicon layer and the second pillar-shaped silicon layer, removing the exposed portion of the polysilicon film by etching, stripping the fourth resist, and removing the metal film by etching to form a first gate electrode and a second gate electrode that are connected to the gate line.

3. The method for producing a semiconductor device according to claim 1, wherein a thick oxide film is deposited on the first pillar-shaped silicon layer, the second pillar-shaped silicon layer, and the planar silicon layer, a thin oxide film is deposited on side walls of the first pillar-shaped silicon layer and the second pillar-shaped silicon layer; and the oxide films are removed by isotropic etching to form the oxide film hard mask on the first pillar-shaped silicon layer and the second pillar-shaped silicon layer and to form the second oxide film on the planar silicon layer, the second oxide film being thicker than the gate insulating film.

4. The method for producing a semiconductor device according to claim 2, further comprising a fifth step including
    forming a first n-type diffusion layer in an upper portion of the first pillar-shaped silicon layer,
    forming a second n-type diffusion layer in a lower portion of the first pillar-shaped silicon layer and in an upper portion of the planar silicon layer,
    forming a first p-type diffusion layer in an upper portion of the second pillar-shaped silicon layer, and
    forming a second p-type diffusion layer in a lower portion of the second pillar-shaped silicon layer and in an upper portion of the planar silicon layer.

5. The method for producing a semiconductor device according to claim 4, further comprising a sixth step including forming silicides on the first n-type diffusion layer, the second n-type diffusion layer, the first p-type diffusion layer, the second p-type diffusion layer, and the gate line.

6. A semiconductor device having a structure in which a source, a gate, and a drain are disposed so as to have a pillar shape perpendicular to a silicon substrate and a gate electrode surrounds a pillar-shaped semiconductor layer, the semiconductor device comprising:
    a planar silicon layer formed on a silicon substrate;
    first and second pillar-shaped silicon layers formed on the planar silicon layer;
    a gate insulating film formed around said first pillar-shaped silicon layer;
    a first gate electrode having a laminated structure of a metal film and a polysilicon film and being formed around said gate insulating film;
    a gate insulating film formed around said second pillar-shaped silicon layer;
    a second gate electrode having a laminated structure of a metal film and a polysilicon film and being formed around said gate insulating film, said polysilicon film having a thickness that is smaller than half a distance between said first pillar-shaped silicon layer and said second pillar-shaped silicon layer;
    a gate line connected to said first and second gate electrodes, said gate line having an upper surface located lower than upper surfaces of said first and second gate electrodes;
    a second oxide film formed between said gate line and said planar silicon layer, said second oxide film being thicker than said gate insulating films;
    a first n-type diffusion layer formed in an upper portion of said first pillar-shaped silicon layer;
    a second n-type diffusion layer formed in a lower portion of said first pillar-shaped silicon layer and in an upper portion of said planar silicon layer;
    a first p-type diffusion layer formed in an upper portion of said second pillar-shaped silicon layer; and
    a second p-type diffusion layer formed in a lower portion of said second pillar-shaped silicon layer and in an upper portion of said planar silicon layer.

7. The semiconductor device according to claim 6, wherein the gate line has a laminated structure of the metal film and a silicide.

8. The semiconductor device according to claim 6, wherein a center line of the gate line is displaced from a line that connects a center point of the first pillar-shaped silicon layer to a center point of the second pillar-shaped silicon layer by a first predetermined distance.

9. The semiconductor device according to claim 8, comprising silicides formed on the first and second n-type diffusion layers and the first and second p-type diffusion layers.

* * * * *